United States Patent
Hamada et al.

(10) Patent No.: US 7,142,445 B2
(45) Date of Patent: Nov. 28, 2006

(54) FERROELECTRIC MEMORY DEVICE, METHOD OF DRIVING THE SAME, AND DRIVER CIRCUIT

(75) Inventors: Yasuaki Hamada, Suwa (JP); Takeshi Kijima, Matsumoto (JP); Eiji Natori, Chino (JP)

(73) Assignee: Seiko Epson Corporation (JP)

( * ) Notice: Subject to any disclaimer, the term of this patent is extended or adjusted under 35 U.S.C. 154(b) by 37 days.

(21) Appl. No.: 10/932,890

(22) Filed: Sep. 2, 2004

(65) Prior Publication Data

US 2005/0078507 A1    Apr. 14, 2005

(30) Foreign Application Priority Data

Sep. 5, 2003    (JP)    ............... 2003-314054

(51) Int. Cl.
  *G11C 11/22*    (2006.01)
  *G11C 5/06*     (2006.01)
  *G11C 5/14*     (2006.01)
  *G11C 7/00*     (2006.01)
  *G11C 8/00*     (2006.01)

(52) U.S. Cl. .................. 365/145; 365/65; 365/189.09; 365/191; 365/230.06

(58) Field of Classification Search .................. 365/145
  See application file for complete search history.

(56) References Cited

U.S. PATENT DOCUMENTS

| | | | |
|---|---|---|---|
| 5,550,770 A * | 8/1996 | Kuroda | 365/145 |
| 5,740,100 A | 4/1998 | Yoo | |
| 5,953,245 A * | 9/1999 | Nishimura | 365/145 |
| 6,459,608 B1 | 10/2002 | Tamura | |
| 6,611,450 B1 | 8/2003 | Oowaki et al. | |
| 6,771,531 B1 * | 8/2004 | Nishihara | 365/145 |
| 2001/0031505 A1 * | 10/2001 | Arita et al. | 438/3 |
| 2002/0176274 A1 * | 11/2002 | Ashikaga | 365/145 |
| 2003/0026123 A1 * | 2/2003 | Takashima | 365/145 |
| 2003/0223266 A1 * | 12/2003 | Yamamura | 365/145 |
| 2004/0081003 A1 * | 4/2004 | Shimada et al. | 365/200 |
| 2004/0145936 A1 | 7/2004 | Maruyama | |
| 2005/0073869 A1 * | 4/2005 | Gudesen et al. | 365/145 |

FOREIGN PATENT DOCUMENTS

| | | |
|---|---|---|
| JP | 09-116107 | 5/1997 |
| JP | 2001-515256 | 9/2001 |

* cited by examiner

*Primary Examiner*—Amir Zarabian
*Assistant Examiner*—Ly Duy Pham
(74) *Attorney, Agent, or Firm*—Harness, Dickey & Pierce, P.L.C.

(57) ABSTRACT

A ferroelectric memory device preventing an imprint and including a plurality of wordlines, a plurality of bitlines, a plurality of ferroelectric memory cells, a wordline driver which drives the wordlines, and a bitline driver which drives the bitlines. The wordline driver and the bitline driver switch an operation mode of the ferroelectric memory device to a first mode which is one of a data reading mode, a data rewriting mode and a data writing mode, by applying a voltage Vs having a first polarity to at least one ferroelectric memory cell selected from the ferroelectric memory cells. The wordline driver and the bitline driver switch the operation mode to a second mode in which the ferroelectric memory device prevents an imprint by applying a voltage (−Vs/3) having a second polarity which is the reverse of the first polarity to the selected ferroelectric memory cell, after the operation mode has been switched to the first mode at least once, the voltage of the second polarity causing no inversion of data stored in the ferroelectric memory cells.

11 Claims, 15 Drawing Sheets

READING FROM SELECTED CELL 18a (WRITING OF DATA "0")

WL1

WL2

BL1

BL2

FERROELECTRIC MEMORY DEVICE, METHOD OF DRIVING THE SAME, AND DRIVER CIRCUIT

Japanese Patent Application No. 2003-314054, filed on Sep. 5, 2003, is hereby incorporated by reference in its entirety.

BACKGROUND OF THE INVENTION

The present invention relates to a ferroelectric memory device, a method of driving the same, and a driver circuit.

A ferroelectric memory device including a ferroelectric capacitor as a storage device has characteristics such as an operation speed equal to that of a DRAM and nonvolatility similar to that of a flash memory, and is expected to be a memory device which may replace a conventional memory.

As the ferroelectric memory device, an active type ferroelectric memory device including a 1T/1C cell in which one transistor and one capacitor (ferroelectric) are disposed in each cell, or a 2T/2C cell in which a reference cell is further disposed in each cell, has been known. However, since the degree of integration of the 1T/1C cells and 2T/2C cells is limited, a memory device structure with a reduced size has been demanded taking an increase in the degree of integration in the future into consideration.

A ferroelectric material has a data retention function, and a memory operation can be achieved by using only a ferroelectric capacitor. Therefore, a ferroelectric memory device in which a memory cell is formed by only one ferroelectric capacitor (1C cell) has been proposed (see Japanese Patent Application Laid-open No. 9-116107 and published Japanese translation of PCT international publication for patent application No. 2001-515256).

However, when a positive select voltage is repeatedly applied to a selected memory cell, it is difficult to write data into the selected memory cell by applying a negative select voltage. This is because an imprint occurs in which the hysteresis characteristics of the ferroelectric memory cell shift on the negative electric field side in the direction in which the absolute value of the select voltage is increased. The imprint also occurs when the negative select voltage is repeatedly applied. In this case, the hysteresis characteristics of the ferroelectric memory cell shift on the positive electric field side in the direction in which the absolute value of the select voltage is increased. If an electric field in one direction is continuously and repeatedly applied to the selected memory cell, an error occurs in which the polarization of the ferroelectric capacitor is not reversed even if the select voltage with a large absolute value is applied.

BRIEF SUMMARY OF THE INVENTION

According to one aspect of the present invention, there is provided a method of driving a ferroelectric memory device, comprising:

a first step of performing one of data reading, data rewriting, and data writing by applying a voltage having a first polarity to at least one ferroelectric memory cell selected from a plurality of ferroelectric memory cells formed at intersections between a plurality of wordlines and a plurality of bitlines; and a second step of preventing an imprint by applying a voltage having a second polarity which is the reverse of the first polarity to the selected ferroelectric memory cell after the first step has been performed at least once, the voltage of the second polarity causing no inversion of data stored in the ferroelectric memory cells.

According to another aspect of the present invention, there is provided a ferroelectric memory device comprising:

a plurality of wordlines disposed in parallel;

a plurality of bitlines disposed in parallel and intersect the wordlines;

a plurality of ferroelectric memory cells formed at intersections between the wordlines and the bitlines;

a wordline driver which drives the wordlines; and a bitline driver which drives the bitlines, wherein:

the wordline driver and the bitline driver switch an operation mode of the ferroelectric memory device to a first mode which is one of one of a data reading mode, a data rewriting mode and a data writing mode, by applying a voltage having a first polarity to at least one ferroelectric memory cell selected from the ferroelectric memory cells; and the wordline driver and the bitline driver switch the operation mode to a second mode in which the ferroelectric memory device prevents an imprint by applying a voltage having a second polarity which is the reverse of the first polarity to the selected ferroelectric memory cell, after the operation mode has been switched to the first mode at least once, the voltage of the second polarity causing no inversion of data stored in the ferroelectric memory cells.

According to a further aspect of the present invention, there is provided a driver circuit connected to a ferroelectric memory section having a plurality of ferroelectric memory cells formed at intersections between a plurality of wordlines and a plurality of bitlines, the driver circuit comprising:

a wordline driver which drives the wordlines; and a bitline driver which drives the bitlines, wherein:

the wordline driver and the bitline driver switch an operation mode of the ferroelectric memory device to a first mode which is one of a data reading mode, a data rewriting mode and a data writing mode, by applying a voltage having a first polarity to at least one ferroelectric memory cell selected from the ferroelectric memory cells; and the wordline driver and the bitline driver switch the operation mode to a second mode in which the ferroelectric memory device prevents an imprint by applying a voltage having a second polarity which is the reverse of the first polarity to the selected ferroelectric memory cell, after the operation mode has been switched to the first mode at least once, the voltage of the second polarity causing no inversion of data stored in the ferroelectric memory cells.

DETAILED DESCRIPTION OF THE EMBODIMENTS

Figure 1:
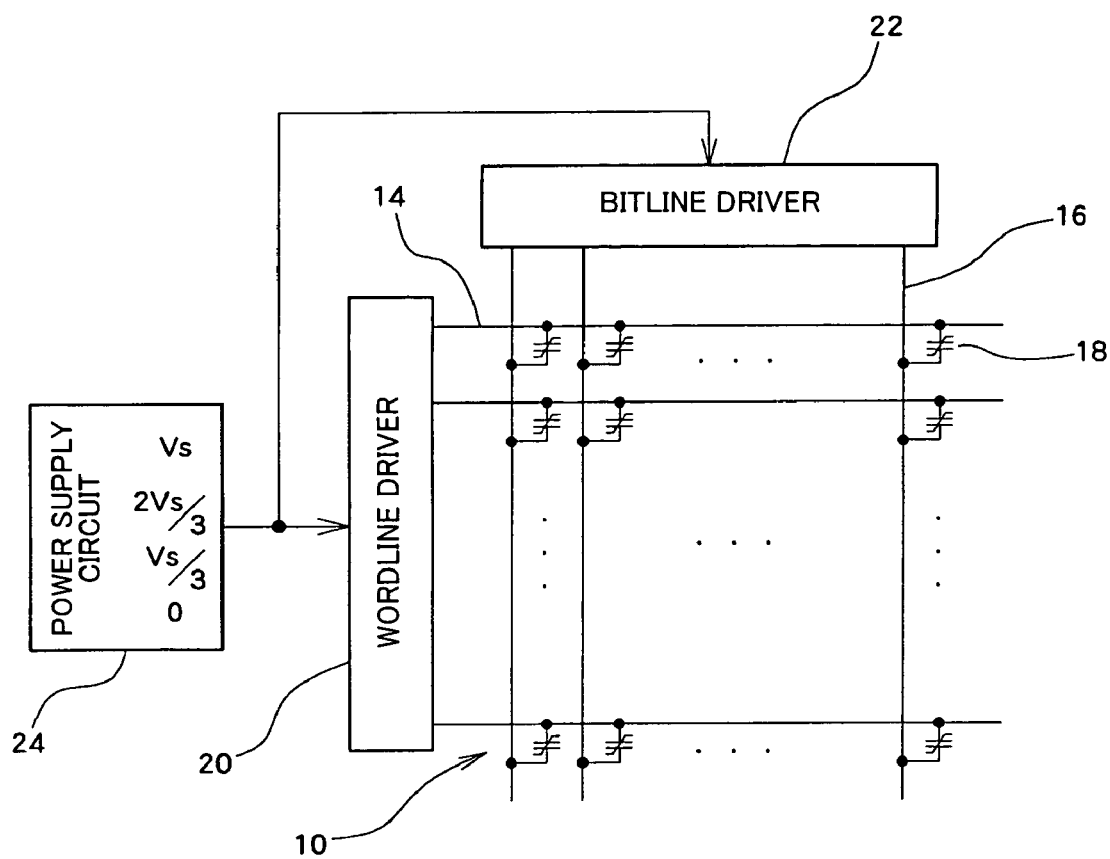
FIG. 1 is a block diagram of a ferroelectric memory device according to one embodiment of the present invention.

Embodiments of the present invention will be described below.

According to one embodiment of the present invention, there are provided a ferroelectric memory device and a method of driving a ferroelectric memory device, each of which comprising:

a first step (or a first mode) of performing one of data reading, data rewriting, and data writing by applying a voltage having a first polarity to at least one ferroelectric memory cell selected from a plurality of ferroelectric memory cells formed at intersections between a plurality of wordlines and a plurality of bitlines; and a second step (or a second mode) of preventing an imprint by applying a voltage having a second polarity which is the reverse of the first polarity to the selected ferroelectric memory cell after the first step has been performed at least once, the voltage of the second polarity causing no inversion of data stored in the ferroelectric memory cells.

In this embodiment, the voltage at a polarity the reverse of the polarity of the select voltage is necessarily applied to the selected cell at a certain frequency in the electric field direction which does not cause the stored data to be reversed. Therefore, even in a severe situation in which the select voltage in one electric field direction is repeatedly applied, an imprint is reduced or prevented by the reverse polarity voltage applied at a certain frequency.

In particular, this embodiment is suitable for a cross-point type or passive type ferroelectric memory device in which each of a plurality of ferroelectric memory cells includes only a ferroelectric capacitor.

This method of driving a ferroelectric memory device may further comprise a step of equalizing potentials of one of the wordlines and one of the bitlines connected to the selected ferroelectric memory cell, between the first and second steps.

In this method of driving a ferroelectric memory device, the second step may be performed each time the first step is performed, or the second step may be performed whenever the first step is repeated predetermined two or more times.

In this ferroelectric memory device, the wordline driver may supply one of two types of selected potentials to one of the wordlines connected to the selected ferroelectric memory cell, and supply one of two types of unselected potentials to another one of the wordlines connected to an unselected ferroelectric memory cell among the ferroelectric memory cells in the first mode; and the bitline driver may supply the other of the two types of selected potentials to one of the bitlines connected to the selected ferroelectric memory cell, and supply the other of the two types of unselected potentials to another one of the bitlines connected to the unselected ferroelectric memory cell in the first mode.

In this case, the wordline driver may supply a potential used in the equalization mode to the wordlines in the second mode; and the bitline driver may supply one of the two types of the unselected potentials to one of the bitlines connected to the selected ferroelectric memory cell and supply the potential used in the equalization mode to the other of the bitlines in the second mode.

Alternatively, in this ferroelectric memory device, the bitline driver may supply one of two types of selected potentials to one of the bitlines connected to the selected ferroelectric memory cell, and supply one of two types of unselected potentials to another one of the bitlines connected to an unselected ferroelectric memory cell among the ferroelectric memory cells in the first mode; and the wordline driver may supply the other of the two types of selected potentials to one of the wordlines connected to the selected ferroelectric memory cell, and supply the other of the two types of unselected potentials to another one of the wordlines connected to the unselected ferroelectric memory cell in the first mode.

In this case, the bitline driver may supply a potential used in the equalization mode to the bitlines in the second mode; and the wordline driver may supply one of the two types of the unselected potentials to one of the wordlines connected to the selected ferroelectric memory cell and supply the potential used in the equalization mode to the other of the wordlines in the second mode.

This ferroelectric memory device may further comprise a counter which determines whether or not the operation mode is switched to the first mode predetermined two or more times, wherein the wordline driver and the bitline driver may switch the operation mode to the second mode based on output from the counter.

In this ferroelectric memory device, the wordlines may be connected to the wordline driver and the number of the wordlines may be N, the bitlines may be connected to the bitline driver and the number of the bitline may be M, and the number of the ferroelectric memory cells may be M×N (M and N are natural numbers larger than 1); and the wordline driver and the bitline driver may switch the operation mode to the first mode when an effective address in at least one of the M×N ferroelectric memory cells is selected, and switch the operation mode to the second mode when an ineffective address which is an address other than the effective address is selected.

A ferroelectric memory cell according to one embodiment of the present invention preferably has hysteresis characteristics with excellent squareness. This is because the adverse effect of disturbance is reduced when the squareness is excellent.

This ferroelectric memory cell with excellent squareness may satisfy $|\Delta Pa/Cu| \geq (n-1) \times \Delta VBL$, where: n is the number of the ferroelectric memory cells connected to one of the bitlines and n is a natural number larger than 1; $\Delta Pa$ is a difference between a function f (Vs) when applying a voltage Vs to one of the n ferroelectric memory cells, and a function f (Vu) when applying a voltage Vu to the other of the n ferroelectric memory cells, provided that a hysteresis function showing polarization P ($\mu C/cm^2$) of the ferroelectric memory cells when a voltage V is applied to the ferroelectric memory cells is f (V), and $\Delta Pa = f(Vs) - f(Vu)$; Cu is a capacitance ($\mu C/cm^2/V$) of an (n-1) ferroelectric memory cell connected to one of the bitlines; and $\Delta VBL$ is the minimum input amplitude (V) which can be amplified by a sense amplifier selectively connected to one of the bitlines.

Alternatively, in a ferroelectric memory cell with excellent squareness, provided that a coercive voltage of the ferroelectric memory cell is denoted by Vc, a voltage having the same polarity as the coercive voltage and applied to the ferroelectric memory cell is denoted by Vs, and $Vs-Vc=\Delta V$, the ferroelectric memory cell may satisfy $\Delta V \leq Vc$.

In a driver circuit for a ferroelectric memory device according one embodiment of the present invention, the wordline driver and the bitline driver of the above ferroelectric memory device can be disposed. The above-described method can also be carried out by the driver circuit.

These embodiments are described below in detail with reference to the drawings.

Figure 2:
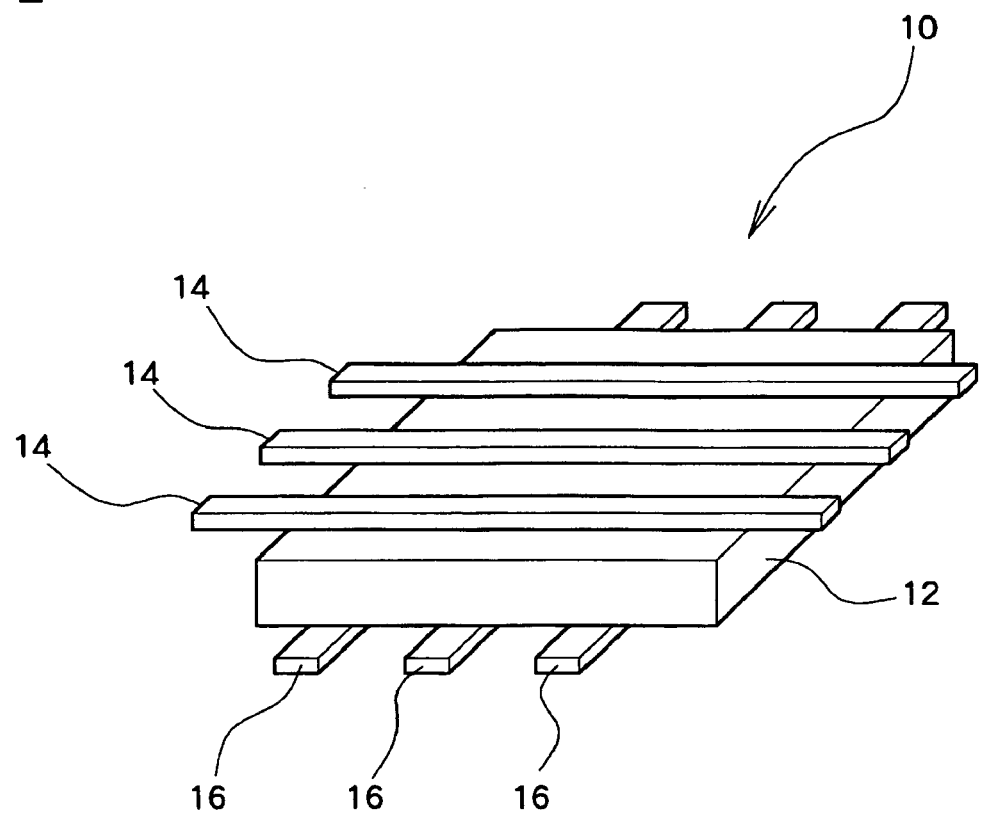
FIG. 2 is a schematic perspective view showing a memory cell array in FIG. 1.

FIG. 1 is a block diagram of an FeRAM which is a ferroelectric memory device according to one embodiment of the present invention, and FIG. 2 is a perspective view schematically showing a memory cell array of the FeRAM. As shown in FIG. 2, a memory cell array 10 includes a ferroelectric thin film 12, a plurality of wordlines 14 arranged on one side of the ferroelectric thin film 12, and a plurality of bitlines 16 arranged on the other side of the ferroelectric thin film 12.

Ferroelectric memory cells 18 are formed at the intersections (cross points) of the wordlines 14 and the bitlines 16 by the above-described structure, as shown in FIG. 1. The memory shown in FIG. 2 having such a structure is called a cross-point FeRAM or a passive type FeRAM. Therefore, the memory shown in FIG. 2 differs from an active type memory including a 1T/1C cell in which one transistor and one capacitor (ferroelectric) are disposed in each cell, or a 2T/2C cell in which a reference cell is further disposed in each cell.

In the FeRAM in this embodiment, since a transistor is unnecessary in the memory cell array 10, the degree of integration can be increased. Moreover, the structure shown in FIG. 2 can be stacked in a plurality of stages. A driver circuit board provided with a CMOS logic may be disposed under the structure shown in FIG. 2, for example.

As a ferroelectric used in this embodiment, an inorganic material such as PZT (lead-zirconium-titanium) having hysteresis characteristics with excellent squareness or an oxide of PZT is suitably used. Other inorganic material or an organic material may also be used.

As an electrode material for forming the wordline 14 and the bitline 16 used in this embodiment, platinum (Pt), iridium (Ir), iridium oxide ($IrO_2$), strontium-ruthenium, or strontium-ruthenium oxide is suitably used, since these materials have high oxidation resistance and high thermal resistance. The electrode material may be other conductive material.

As a driver circuit system for the memory cell array 10, a wordline driver 20 which drives the wordlines 14, a bitline driver 22 which drives the bitlines 16, and a power supply circuit 24 which supplies several types of drive voltages (Vs, 2Vs/3, Vs/3, 0) to the wordline driver 20 and the bitline driver 22 are provided. The wordline driver 20 is connected to one end (left end in FIG. 1) of each of the wordlines 14, and the bitline driver 22 is connected to one end (upper end in FIG. 1) of each of the bitlines 16.

The wordline driver 20 includes a row direction address decoder, and supplies potentials corresponding to a read, write, or rewrite mode (corresponding to data to be written when writing or rewriting) to one wordline 14, whose address is selected, and the remaining unselected wordlines 14. The bitline driver 22 includes a column direction address decoder, and supplies potentials corresponding to the read, write, or rewrite mode (corresponding to data to be written when writing or rewriting) to at least one bitline 16, whose address is selected, and the remaining unselected bitlines 16.

The wordline driver 20 and the bitline driver 22 have the function of supplying potentials to the wordlines 14 and the bitlines 16 in the operation mode and a function of supplying potentials to the wordlines 14 and the bitlines 16 in order to perform the subsequent imprint prevention step.

Figure 3:
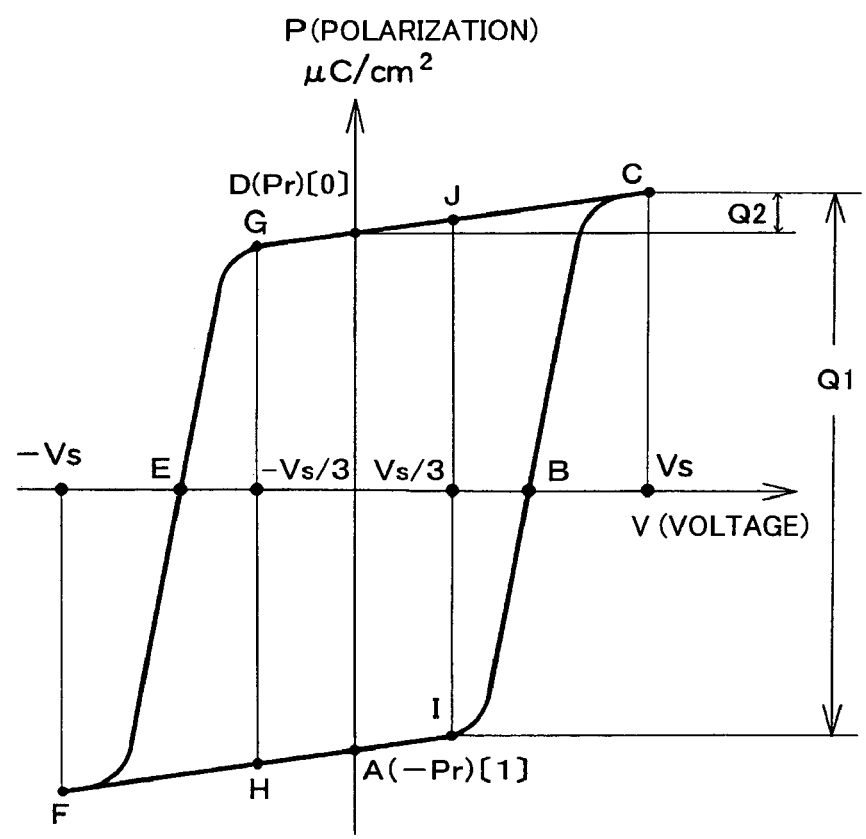
FIG. 3 is a graph showing hysteresis characteristic of a ferroelectric memory cell shown in FIG. 1.

The operation of the FeRAM shown in FIG. 1 is described below. FIG. 3 shows hysteresis characteristics shown by voltage dependence of spontaneous polarization P or polarization charge Q (change in polarization P×capacitor area) of the memory cell 18 shown in FIG. 1.

In FIG. 3, the direction in which the potential of the wordline 14 becomes higher than the potential of the bitline 16 is positive (+), for example. The voltage applied to the memory cell 18 becomes 0 V when the wordline 14 and the bitline 16 are set at the same potential (including power off state in which the wordline 14 and the bitline 16 are set at 0 V). In this case, the ferroelectric capacitor has two types of remanent polarization ±Pr (point A and point D in FIG. 3). For example, two values of memory states can be obtained by defining the remanent polarization Pr at the point D shown in FIG. 3 as a memory state of "0" and defining the remanent polarization −Pr at the point A shown in FIG. 3 as a memory state of "1".

A point C and a point F shown in FIG. 3 are saturation polarization points of the ferroelectric memory cell 18. A point B and a point E shown in FIG. 3 are points at which the polarization direction is reversed. The voltage at which the polarization is zero, such as the point B or the point E, is called a coercive voltage.

According to the hysteresis characteristics shown in FIG. 3, when writing data "0", the polarization of the ferroelectric memory cell 18 is caused to transition to the point C shown in FIG. 3 by applying a voltage Vs to the ferroelectric memory cell 18, and is caused to transition to the point D by applying 0 V to the ferroelectric memory cell 18. When writing data "1", the polarization of the ferroelectric memory cell 18 is caused to transition to the point F shown in FIG. 3 by applying a voltage −Vs to the ferroelectric memory cell 18, and is caused to transition to the point A by applying 0 V to the ferroelectric memory cell 18.

Data is read from the ferroelectric memory cell 18 by applying the voltage +Vs to the ferroelectric memory cell 18 in the polarization state at the point A or the point D.

A selected cell 18a is caused to transition to the polarization state at the point C shown in FIG. 3 by the read operation, irrespective of whether the remanent polarization of the selected cell 18a is at the point A or the point D shown in FIG. 3. In this case, when the polarization state transitions from the point A to the point C (reading of memory state of "1"), the polarization direction is reversed from negative to positive across the point B at which the polarization becomes zero. Therefore, current corresponding to a comparatively large charge amount Q1 shown in FIG. 3 flows through the bitline 16. When the polarization state transitions from the point D to the point C (reading of the memory state of "0"), the polarization direction is not reversed. Therefore, current corresponding to a comparatively small charge amount Q2 shown in FIG. 3 flows through the bitline 16. Therefore, whether the memory state is "1" or "0" can be determined by comparing the current flowing through the bitline 16 with a reference current (not shown).

The potential setting of the wordline 14 and the bitline 16 is described below taking reading of data as an example. The potential setting is performed by the wordline driver 20 and the bitline driver 22 to which four types of potentials (Vs, 2Vs/3, Vs/3, 0) are supplied from the power supply circuit 24. The potentials Vs and 0 V are two types of select potentials, and the potentials 2Vs/3 and Vs/3 are two types of unselect potentials.

Figure 4:
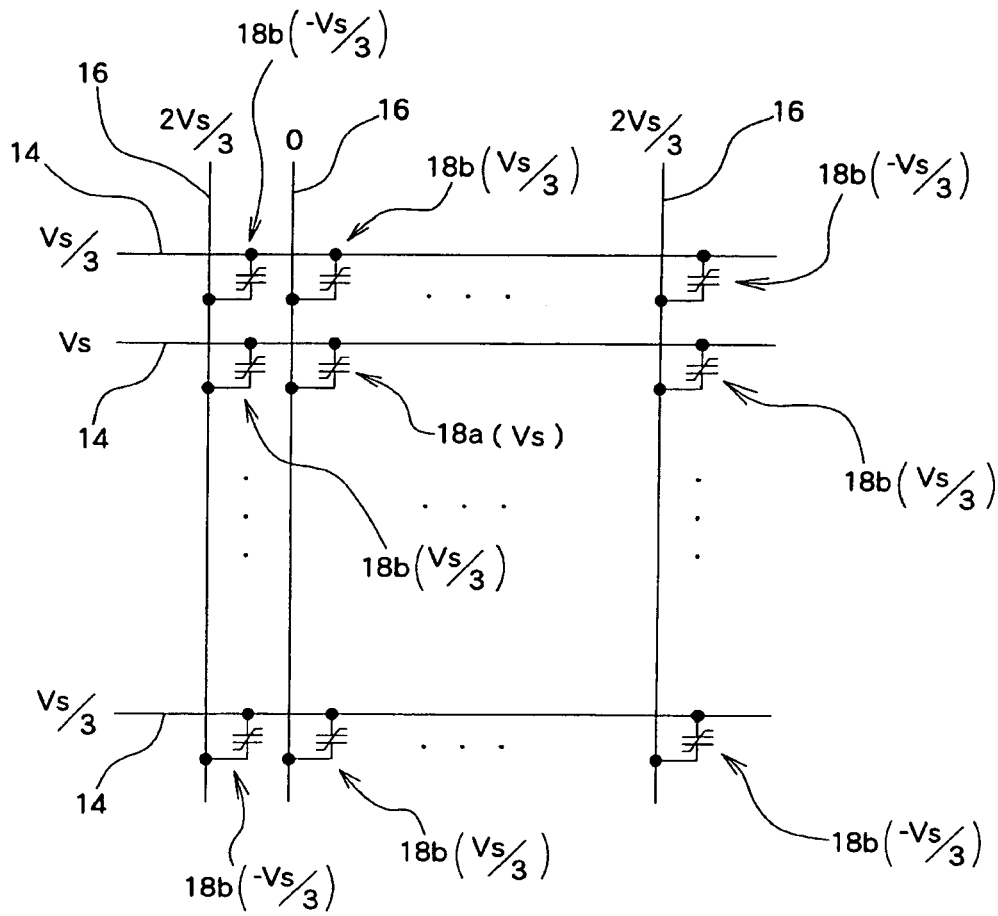
FIG. 4 is a diagram schematically showing the potential setting of wordlines and bitlines of a ferroelectric memory cell array in reading (or in writing of data "0").

FIG. 4 shows one selected cell 18a and unselected cells 18b. The wordline 14 and the bitline 16 connected to the selected cell 18a located at an address (2, 2) are respectively set at a potential Vs (word select potential) and a potential 0 (bit select potential). Therefore, a positive electric field of "Vs−0=Vs" is applied to the selected cell 18a. Therefore, irrespective of whether the remanent polarization of the selected cell 18a is at the point A or the point D shown in FIG. 3, the selected cell 18a transitions to the polarization state at the point C shown in FIG. 3 by the read operation. Therefore, whether the memory state is "1" or "0" can be determined by detecting the current flowing through the bitline 16 connected to the selected cell 18a.

The operation of setting the polarization state at the point C shown in FIG. 3 is the same as the write operation of data "0". Therefore, the potentials are set as shown in FIG. 4 when writing data "0".

The actual data read operation is performed for the memory cells 18 connected to one wordline 14 at the same time, whereby a group of data such as 8-bit or 16-bit data is read at the same time.

Figure 5:
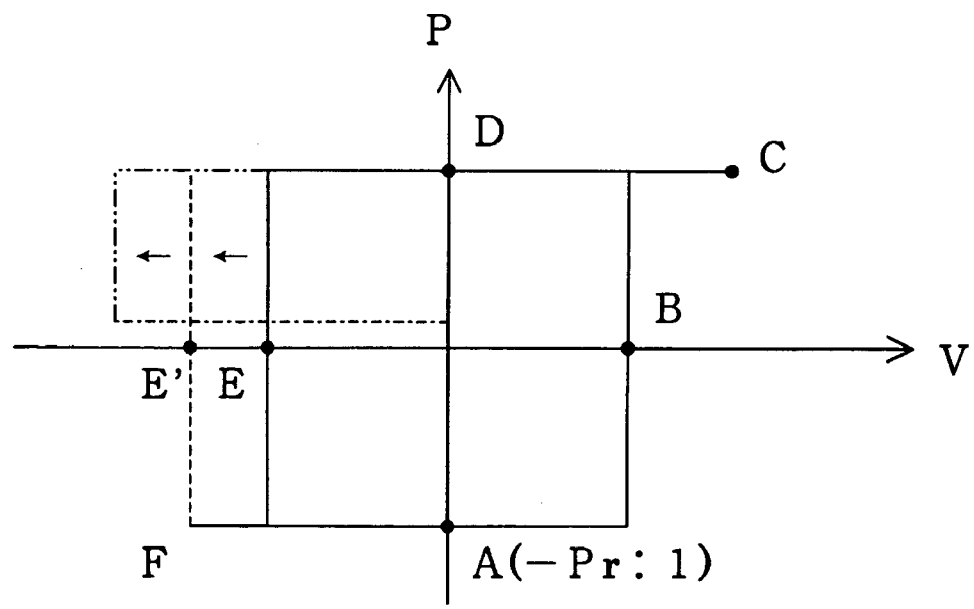
FIG. 5 illustrates an imprint of a ferroelectric capacitor.
Figure 6A:
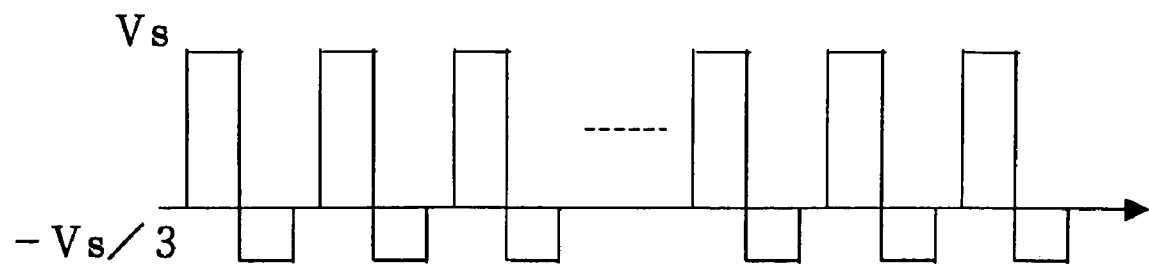
FIG. 6A is a waveform chart showing a drive method according to one embodiment of the present invention.
Figure 6B:
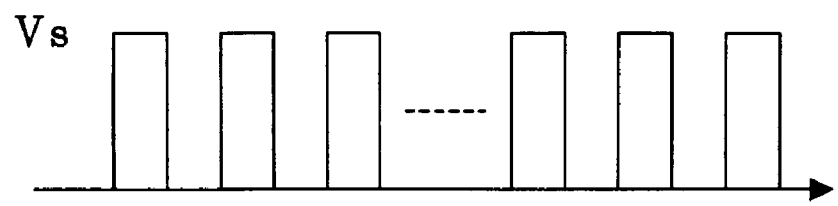
FIG. 6B is a waveform chart showing a drive method in a comparative example.

FIG. 5 schematically shows the hysteresis of a memory cell which retains the polarization (+Pr) at the point D shown in FIG. 3, that is, a memory cell in the memory state of data "0". The data is repeatedly read by selecting the memory cell and causing the polarization to transition to the point C from the point D by repeatedly applying the positive select voltage Vs, as shown in FIG. 6B.

This causes the hysteresis characteristics on the negative electric field side to shift as indicated by the dashed line shown in FIG. 5. The data "1" can be written even if the memory cell has the hysteresis characteristics indicated by the dashed line. The hysteresis characteristics on the negative electric field side further shift as indicated by the dash-dotted line shown in FIG. 5 by repeatedly applying the select voltage Vs shown in FIG. 6B. In the hysteresis characteristics indicated by the dash-dotted line shown in FIG. 5, the polarization is not reversed from positive to negative even if a negative electric field is applied, whereby an error in which data "1" cannot be written occurs.

This imprint significantly occurs as the exponent n of the number of repetitions $10^n$ is increased. The number of repetitions is required to be about $10^{15}$ as the durable life, for example.

This embodiment reduces the above-described imprint. FIG. 6A simplifies the solution principle, and FIG. 6B shows a drive method in a comparative example.

In FIGS. 6A and 6B, data "0" is repeatedly written by causing the polarization state to transition to the point C shown in FIG. 3 by repeatedly applying a select pulse (Vs) in the positive electric field direction to the ferroelectric capacitor. The same description applies to the operation of reading data by causing the polarization state to transition to the point C from the point A (memory state of data "1") shown in FIG. 3 instead of the write operation.

In FIG. 6A, a voltage in the negative electric field direction, such as an unselect voltage (−Vs/3), is applied after applying each select pulse Vs. Specifically, in this embodiment, when the select voltage at a first polarity (positive, for example) is applied in a select period, a voltage at a second polarity (negative in this case) the reverse of the first polarity is applied to the selected memory cell. The voltage at the second polarity must be a voltage which does not cause the data stored in the selected memory cell to be reversed. In this embodiment, the unselect voltage is used as a voltage provided in advance.

An electric field in one direction can be prevented from being continuously applied to the selected memory cell by applying the unselect voltage at a polarity the reverse of the polarity of the select voltage after applying the select voltage to the selected memory cell, even in a severe situation in which the data is written or read by applying the select voltage in the same electric field direction to the selected memory cell.

Therefore, the imprint described with reference to FIG. 5 is reduced or prevented, whereby the durable life of the ferroelectric memory can be increased.

Figure 7:
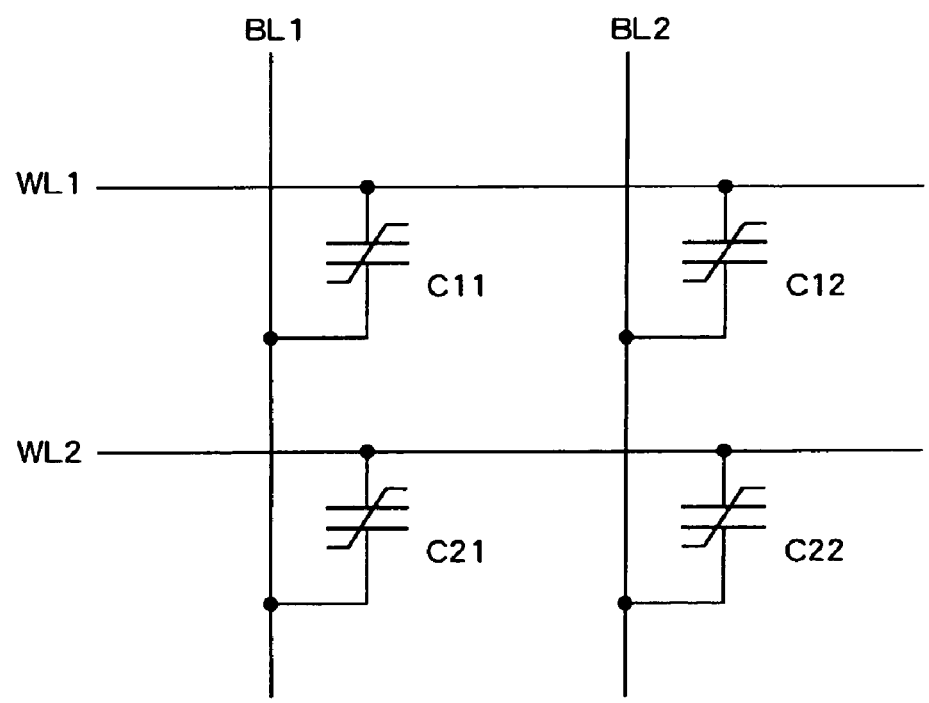
FIG. 7 is an enlarged diagram showing part of the cells shown in FIG. 1.

A more specific drive method in this embodiment is described below. The following description is given on the assumption that a cell C11 shown in FIG. 7 is a selected cell and cells C12, C21, and C22 are unselected cells.

FIGS. 8A to 8D show potentials of two wordlines WL1 and WL2 and potentials of two bitlines BL1 and BL2 when writing data "0" shown in FIG. 3 into the selected cell C11 or reading data "0" or "1" shown in FIG. 3 from the selected cell C11. FIGS. 9A to 9D show voltages applied to the four cells C11, C12, C21, and C22 when applying the potentials shown in FIGS. 8A to 8D to the wordlines WL1 and WL2 and the bitlines BL1 and BL2.

A drive period shown in each drawing is roughly divided into a data "1" write period T1, an equalization period T2, and an imprint prevention period T3. In this embodiment, provided that the minimum pulse width is denoted by W, the write period T1=5W, the equalization period T2=W, and the imprint prevention period T3=W. However, the present invention is not limited thereto.

Figure 8B:
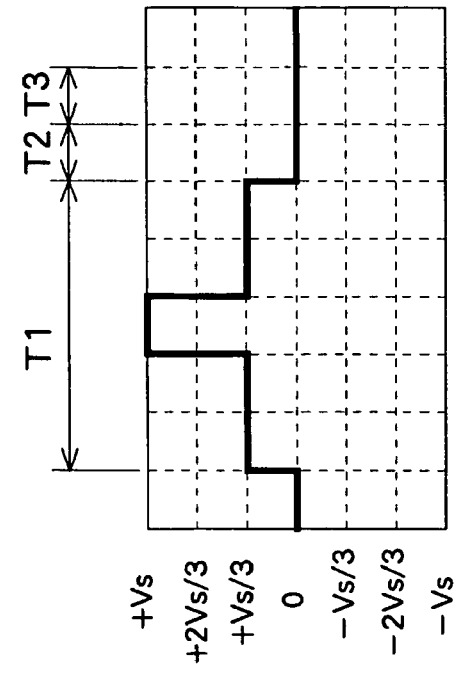
Figure 8D:
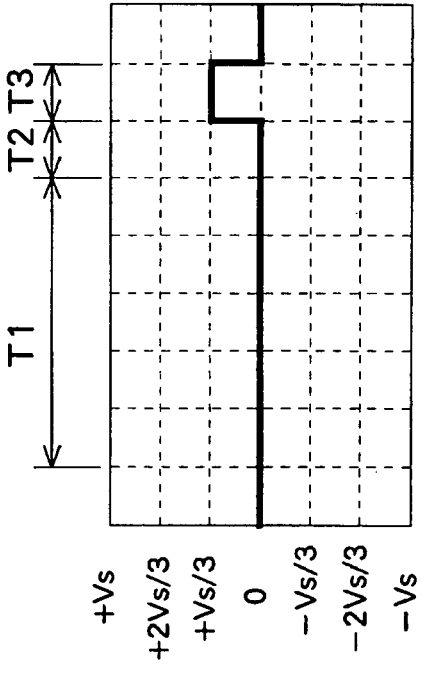
Figure 9A:
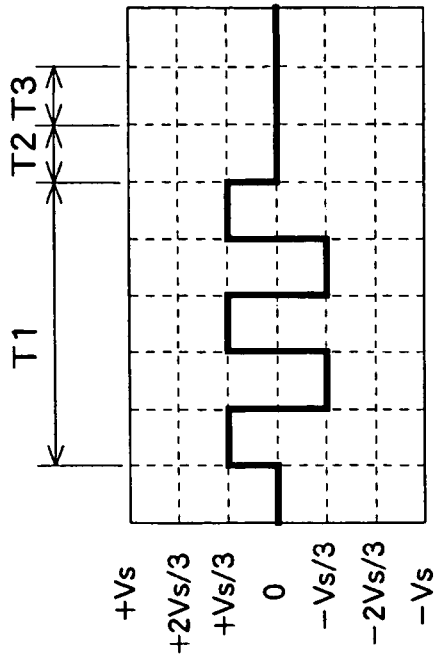
FIGS. 9A, 9B, 9C, and 9D are waveform charts showing voltages applied to selected cells C11 to C22 shown in FIG. 7 according to the potential setting shown in FIGS. 8A to 8D.
Figure 9B:
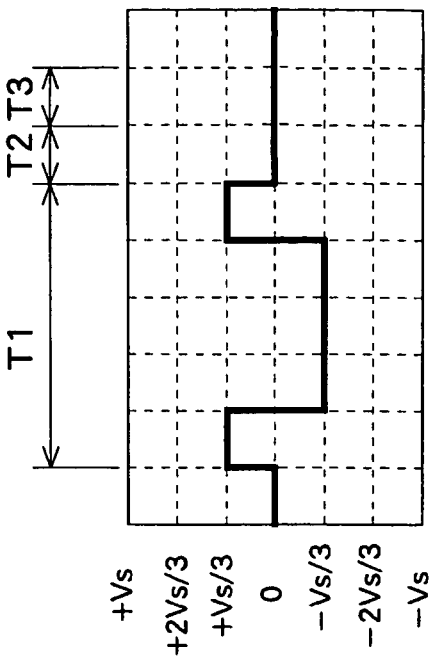
Figure 9C:
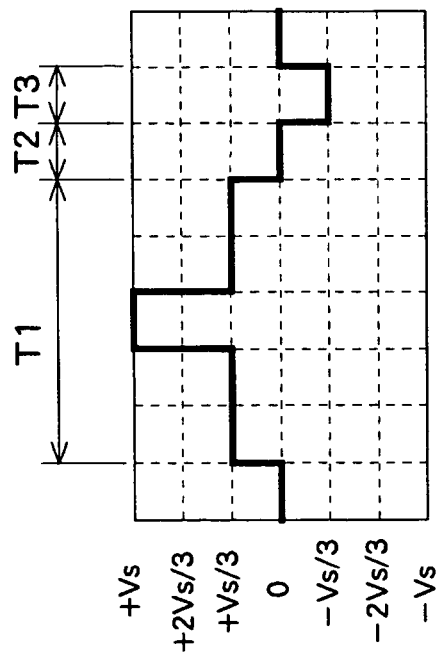
Figure 9D:
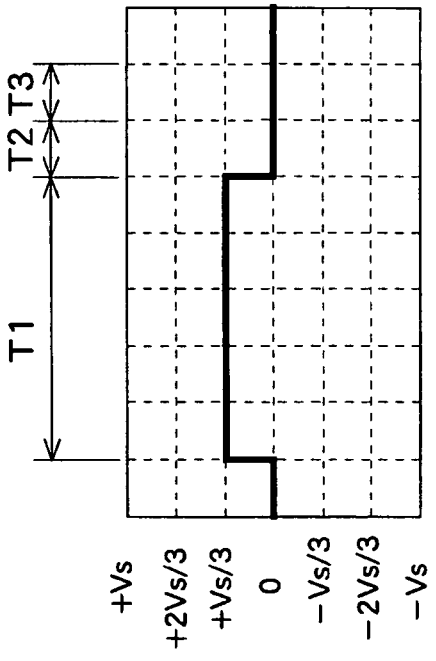

In order to set the selected cell C11 in the saturation polarization state at the point C shown in FIG. 3, a select word potential (Vs) with a pulse width of W shown in FIG. 9A is applied to the wordline WL1 connected to the selected cell C11, and a select bit potential (0) shown in FIG. 9C is applied to the bitline BL1 connected to the selected cell C11. In this case, a voltage (Vs) in the positive electric field direction is applied between both ends of the selected cell C11, as shown in FIG. 12A. In the write period T1, the unselect voltage (±Vs/3) is applied to the unselected cells C12, C21, and C22. Therefore, an unselect word potential (Vs/3) is applied to the wordline WL2 as shown in FIG. 8B, and an unselect bit potential (2Vs/3) is applied to the bitline BL2 as shown in FIG. 8D.

Figure 8A:
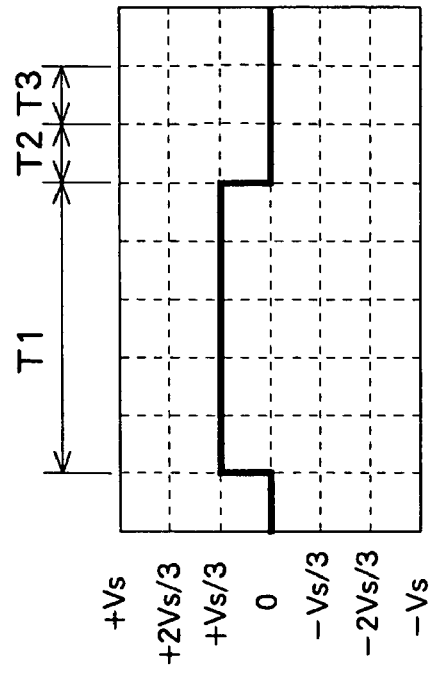
FIGS. 8A, 8B, 8C, and 8D are waveform charts showing potentials of two wordlines and two bitlines when writing data "0" into a selected cell C11.
Figure 8C:
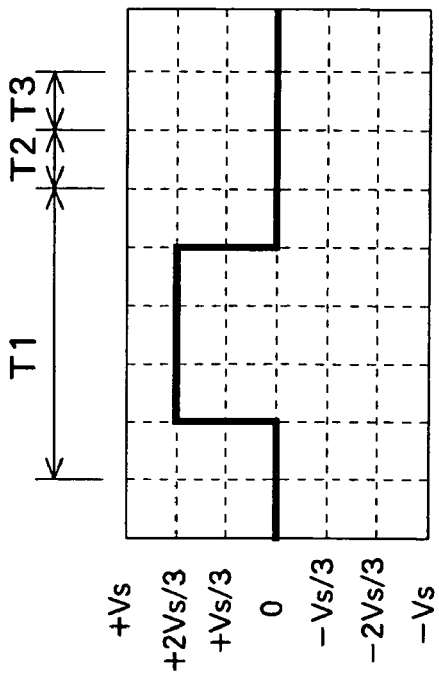

In the waveform charts shown in FIGS. 8A to 8D, a voltage of which the absolute value is greater than the absolute value of the unselect voltage (±Vs/3) is not applied to the unselected cells C12, C21, and C22, even if each voltage pulse is shifted on the time axis. For example, the unselect bit potential (2Vs/3) with a pulse width of 3W is applied to the bitline BL2 at the timing at which the select word potential Vs with a pulse width of W is applied to the selected wordline WL. The unselect word potential (Vs/3) with a pulse width of 5W is applied to the wordlines WL1 and WL2 at the timing at which the unselect bit potential (2Vs/3) with a pulse width of 3W is applied to the bitline BL2. This prevents a voltage of which the absolute value is greater than the absolute value of the unselect voltage (±Vs/3) from being applied to the unselected cells C12, C21, and C22, even if the voltage pulse of the select word voltage Vs shown in FIG. 8A is shifted on the time axis or the voltage pulse of the unselect bit potential (2Vs/3) shown in FIG. 8D is shifted on the time axis.

In the equalization period T2, all the wordlines and the bitlines are set at the same potential such as 0 V This causes the polarization state of the selected cell, which has transitioned to the point C shown in FIG. 3 in the write period T1, to transition to the point J within the write period T1 and transition to the point D by the equalization operation. The polarization state of the unselected cell transitions to the point G or J (when the polarization state is at the point D) or the point H or I (when the polarization state is at the point A) within the write period T1, and returns to the original point D or A.

In the imprint prevention period T3, the unselect voltage (−Vs/3) at a polarity the reverse of the polarity of the select voltage Vs applied to the selected memory cell C11 is applied to the selected memory cell C11 (see FIG. 9A). Therefore, in the imprint prevention period T3, the wordlines WL1 and WL2 and the bitline BL2 are maintained at 0 V, and the unselect voltage (Vs/3) is applied to only the bitline BL1.

In the imprint prevention period T3, the unselect voltage (−Vs/3) is applied to the selected cell C11 and the unselected cell C21, and 0 V is applied to the remaining unselected cells C12 and C22, as shown in FIGS. 9A to 9D. As described above, the positive select voltage Vs is applied to the selected memory cell C11 in the write period T1, and the unselect voltage (−Vs/3) at a polarity the reverse of the polarity of the select voltage Vs is applied to the selected memory cell C11 in the imprint prevention period T3 after the equalization period T2. Therefore, since the unselect voltage (−Vs) is applied each time the select voltage Vs is applied, even if the select voltage Vs is repeatedly applied to the selected cell C11, the imprint is reduced or prevented by the above-described principle.

In the case where the select voltage (−Vs) is applied to the selected cell C11 in the write period T1, the unselect voltage (+Vs/3) is applied to the selected cell C11 in the imprint prevention period T3. In this case, the potential shown in FIG. 8A is supplied to the wordline WL1, the potential shown in FIG. 8A is supplied to the bitline BL1, the potential shown in FIG. 8D is supplied to the wordline WL2, and the potential shown in FIG. 8C is supplied to the bitline BL2.

Figure 10:
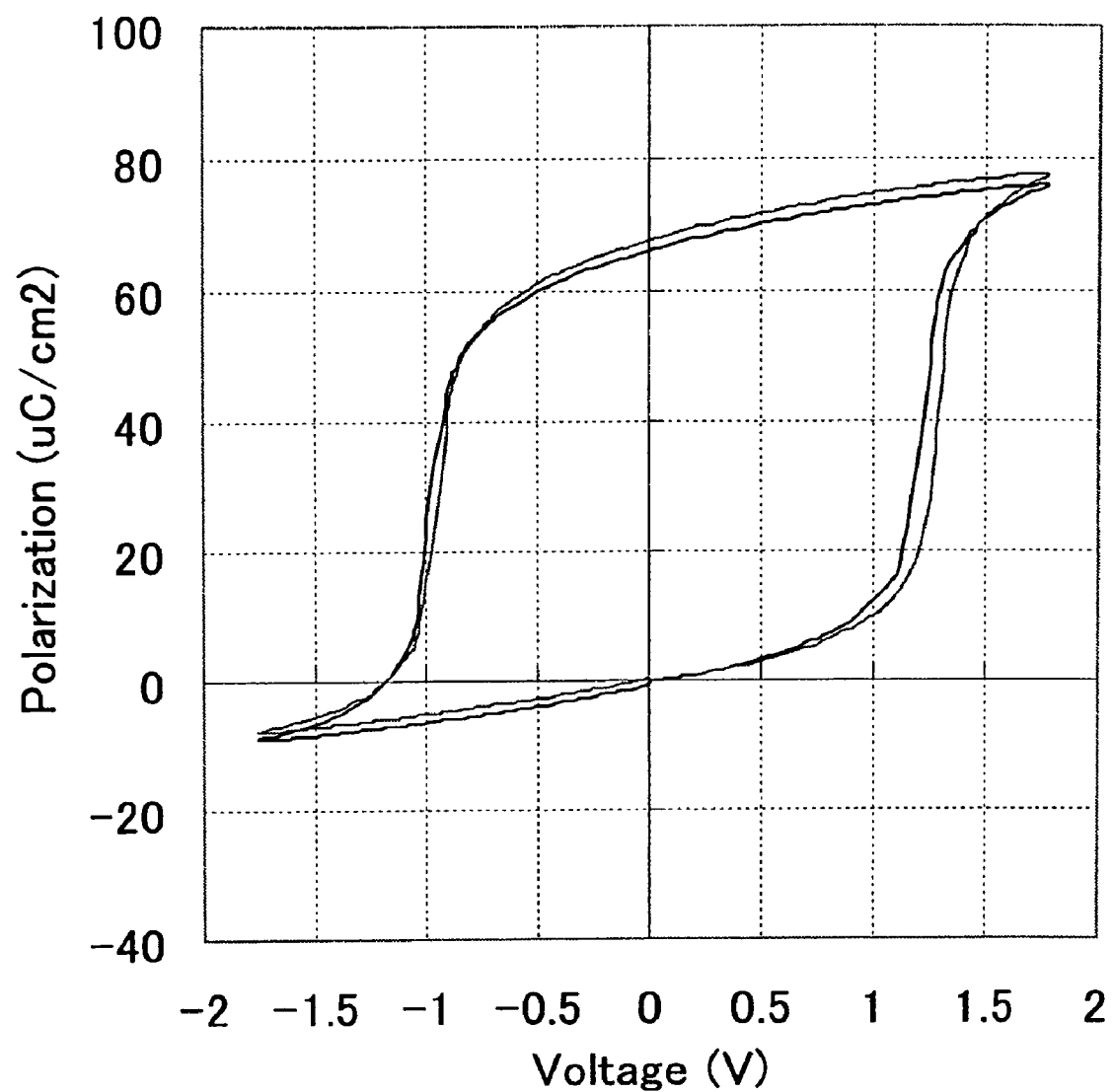
FIG. 10 is a graph showing characteristic of a ferroelectric capacitor in which an imprint does not occur according to one embodiment of the present invention.

FIG. 10 shows hysteresis characteristics before and after the imprint in this embodiment. Almost no change was observed between initial characteristics 100 and characteristics 110 after continuously applying the negative select voltage.

Figure 11:
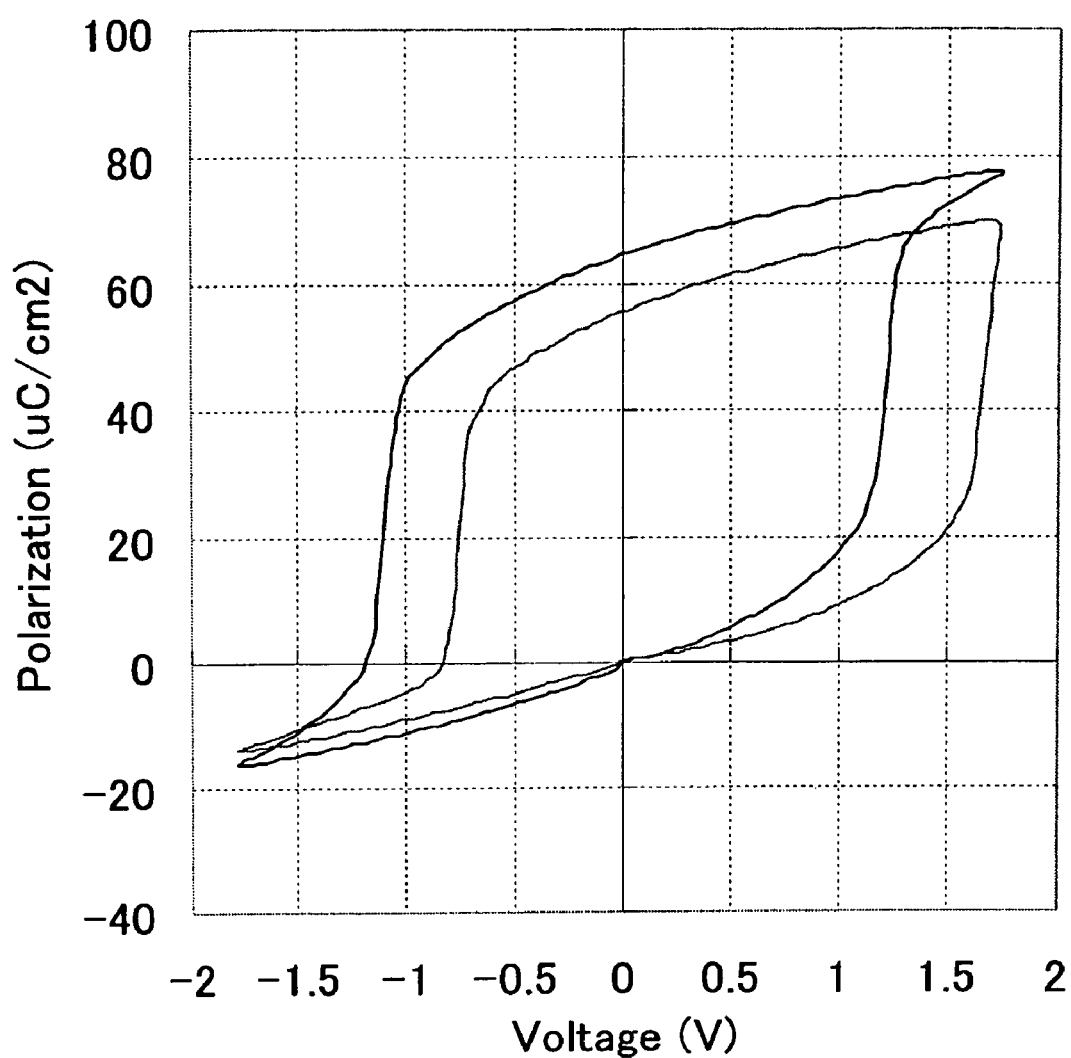
FIG. 11 is a graph showing characteristic a ferroelectric capacitor in a comparative example in which an imprint occurs.

FIG. 11 shows hysteresis characteristics before and after the imprint in a comparative example. An imprint occurred in characteristics 130 after continuously applying the negative select voltage in comparison with initial characteristics 120.

As shown in FIG. 9B, the unselect voltage (−Vs/3) is applied to the unselected cell C21 which shares the bitline BL1 with the selected cell C11 in the imprint prevention period T3. This is undesirable from the viewpoint of disturbance.

However, the disturbance can be reduced by improving the squareness of the hysteresis of the ferroelectric memory. Therefore, it is preferable to apply this embodiment to a ferroelectric memory device having hysteresis characteristics with excellent squareness.

A disturbance in a ferroelectric memory having hysteresis characteristics with poor squareness (FIG. 12) is briefly described below.

Figure 12:
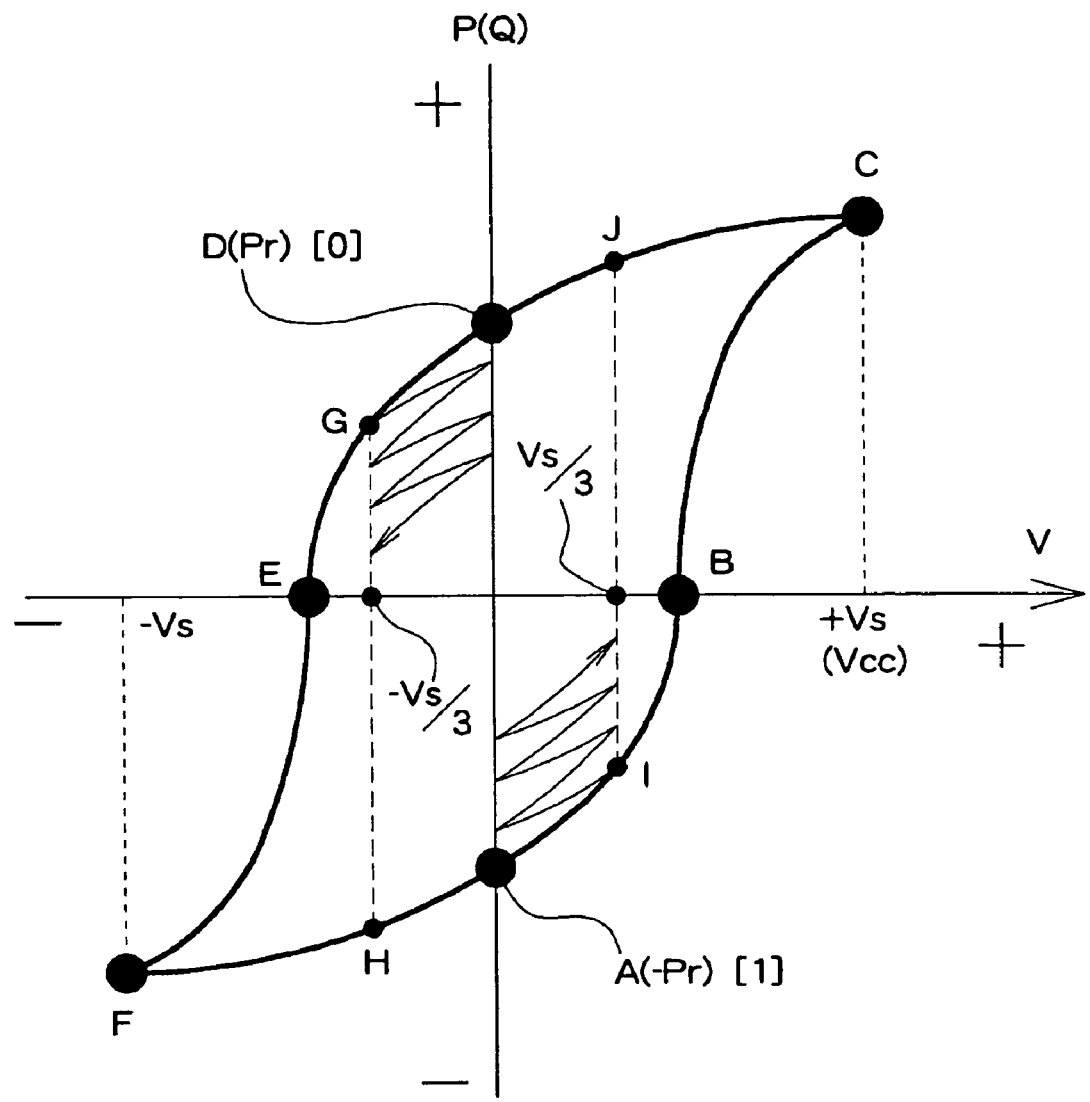
FIG. 12 is a graph showing characteristic for illustrating a disturbance phenomenon of a ferroelectric capacitor.

FIG. 12 shows the case where the unselect voltage −Vs/3 is repeatedly applied to the unselected memory cell in the polarization state at the point D in the order of $10^n$ in the electric field direction which causes the polarization state to be reversed (negative electric field direction which causes the polarization state to transition toward the point E) each time the operation mode of other selected cells occurs. FIG. 12 also shows the case where the unselect voltage Vs/3 is repeatedly applied to the unselected memory cell in the polarization state at the point A in the order of $10^n$ in the electric field direction which causes the polarization state to be reversed (positive electric field direction which causes the polarization state to transition toward the point B) each time the operation mode of other selected cells occurs.

Figure 13A:
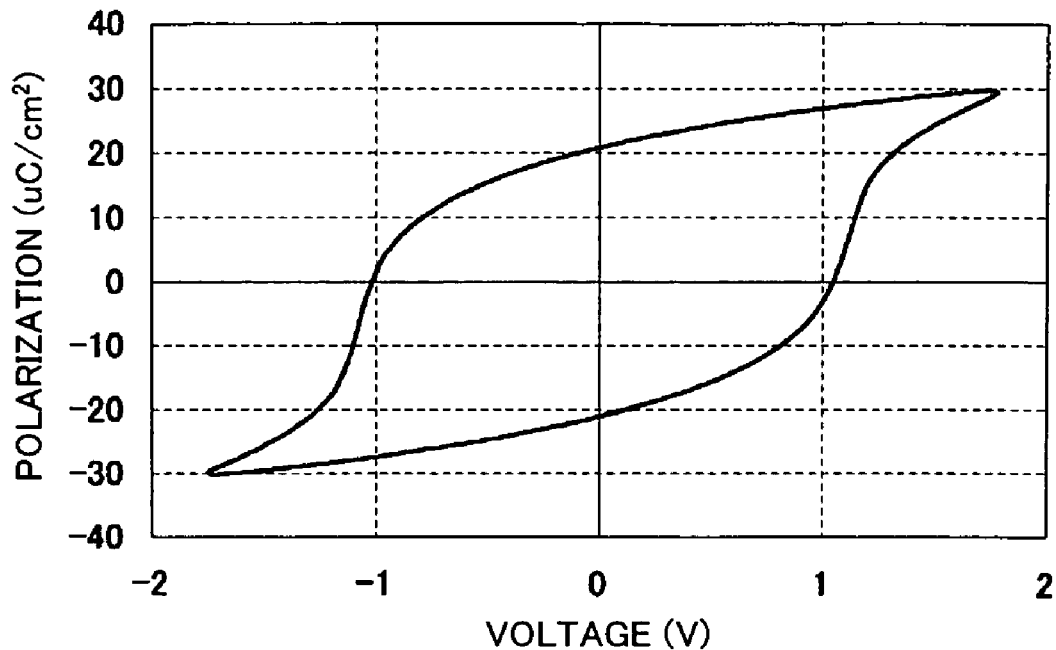
FIG. 13A is a graph showing hysteresis characteristics with poor squareness.
Figure 13B:
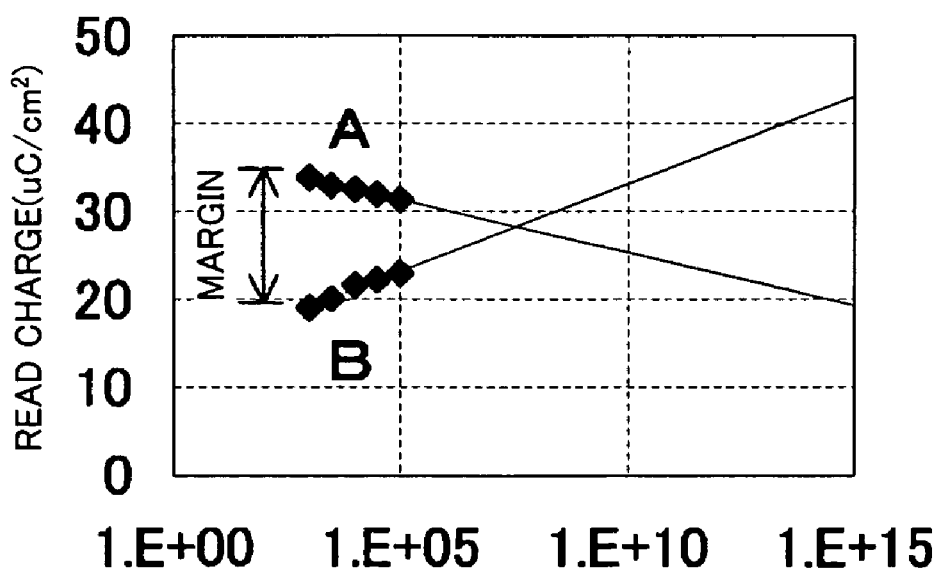
FIG. 13B is a graph showing disturbance characteristics of a ferroelectric capacitor having the characteristics shown in FIG. 13A.

In either case, the absolute value of the remanent polarization Pr or −Pr is decreased as the exponent n of the number of repetitions $10^n$ is increased. As shown in FIG. 13B, a disturbance significantly occurs in a ferroelectric memory having hysteresis characteristics with poor squareness shown in FIG. 13A. As shown in FIG. 13B, the margin between an electric charge A of data "0" and an electric charge B of data "1" when reading data is decreased as the exponent n of the number of repetitions $10^n$ is increased. The margin is finally lost, whereby the data cannot be determined by a sense amplifier.

Figure 14A:
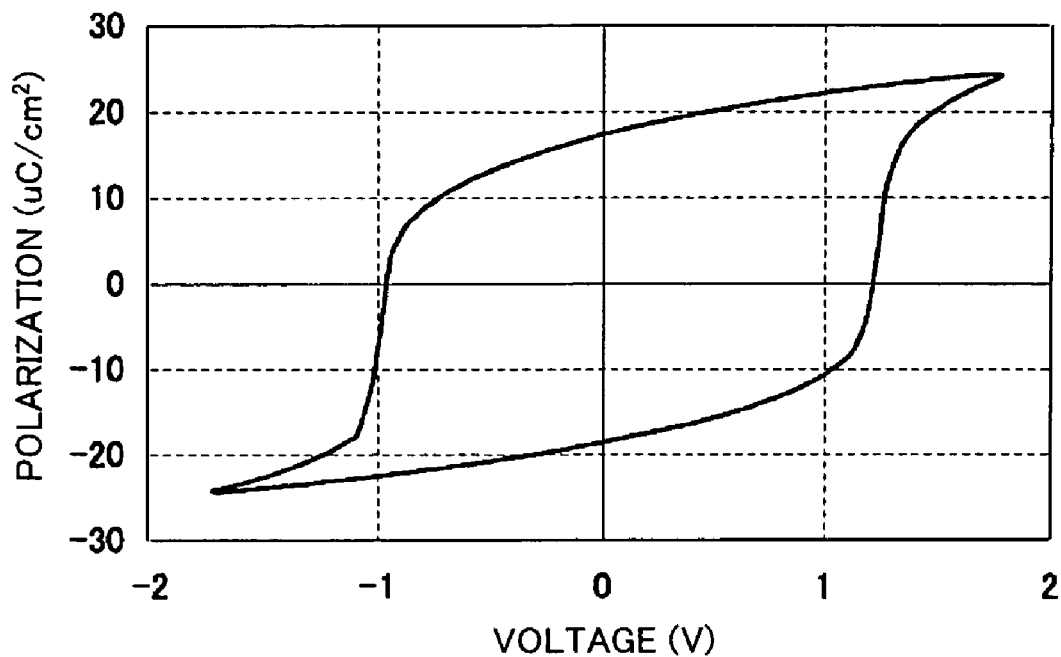
FIG. 14A is a graph showing hysteresis characteristics with excellent squareness.
Figure 14B:
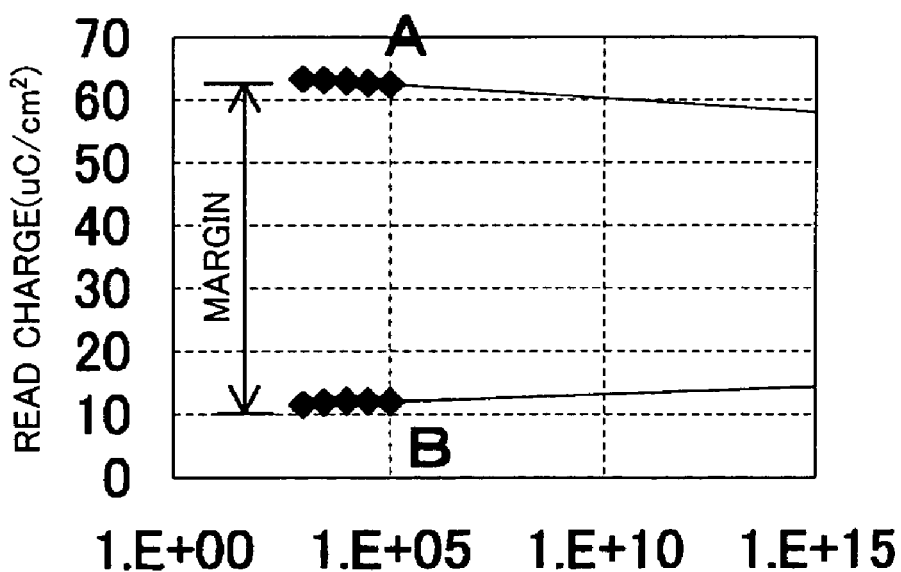
FIG. 14B is a graph showing non-disturbance characteristics of a ferroelectric capacitor having the characteristics shown in FIG. 14A.

On the other hand, a disturbance does not pose a problem in a ferroelectric memory having hysteresis characteristics with excellent squareness shown in FIG. 14A. This is because the margin between the electric charge A of data "0" and the electric charge B of data "1" when reading data can be sufficiently secured even if the exponent n of the number of repetitions $10^n$ is increased, as shown in FIG. 14B. Therefore, the disturbance does not pose a problem even if an unnecessary unselect voltage (−Vs/3) is applied to the unselected cell C21 in the imprint prevention period T3 as shown in FIG. 9B.

In this embodiment, the imprint prevention period may be provided each time the write operation, the rewrite operation, and the read operation are completed. A disturbance period may be provided each time these operations are completed two or more times.

Figure 15:
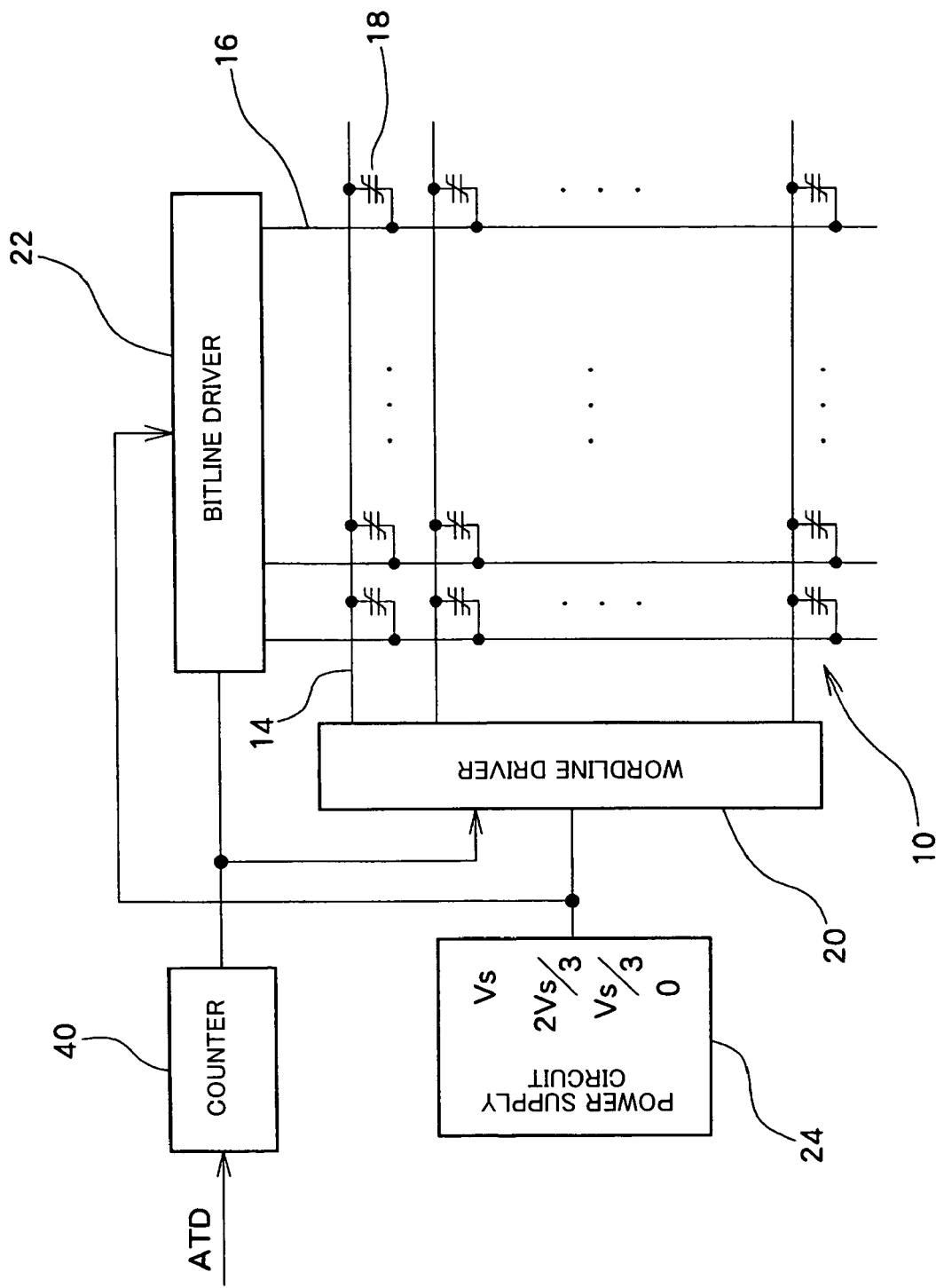
FIG. 15 is a block diagram of a ferroelectric memory device including a counter which determines the timing of performing an imprint prevention step.

As shown in FIG. 15, a counter 40 which counts the number of write operations and read operations and issues instructions for the operation in the imprint prevention period T3 when the counter value reaches a predetermined value may be provided. The counter 40 may count an address transition signal ATD in order to count the number of write operations and read operations. The rewrite operation is necessarily performed after the read operation, and writing of data "0" and writing of data "1" are necessary as the write operation. Therefore, since it is detected that the above-described two operations have been completed when the counter 40 counts the address transition signal ATD once, the count-up value may be determined taking this feature into consideration.

Figure 16:
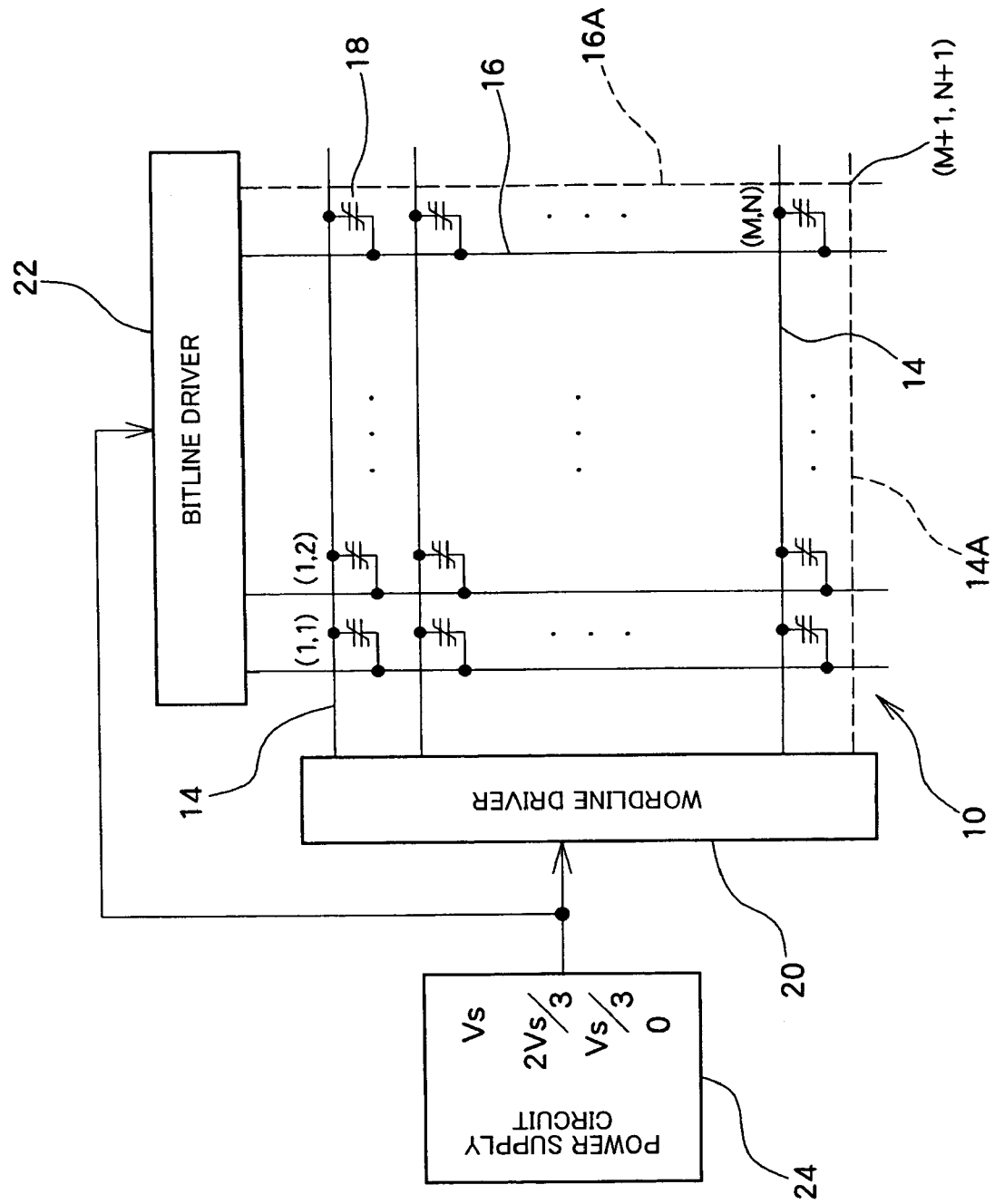
FIG. 16 is a block diagram of a ferroelectric memory device which determines the timing of performing an imprint prevention step by designating an ineffective address.

FIG. 16 shows another embodiment in which the operation in the imprint prevention period T3 is performed when an ineffective address (M+1, N+1) which is not used as the memory address is designated (M and N are natural numbers larger than 1).

In FIG. 16, the number of effective wordlines 14 is N, the number of effective bitlines 16 is M, and the number of ferroelectric memory cells 18 is (M×N) in total. A virtual (N+1)th wordline 14A and a virtual (M+1)th bitline 16A are taken as examples. An address (M+1, N+1) is an ineffective address.

The above-described write and read operations are performed by designating one of the actual addresses (1, 1) to (M, N). Since each of the wordline driver 20 and the bitline driver 22 includes the address decoder as described above, the above-described operation is performed when the effective address is designated. For example, the wordline driver 20 and the bitline driver 22 are set so that the imprint prevention step is performed when the ineffective address such as the address (M, N) is designated. This enables the imprint prevention step to be performed merely by designating the address without using the counter 40 or the like.

This embodiment may be suitably implemented in a ferroelectric memory device having hysteresis characteristics with excellent squareness, as disclosed in the prior application applied for by the applicant of the present invention (Japanese Patent Application No. 2003-286562) or the like.

The hysteresis characteristics with excellent squareness satisfy the following equation.

$$|\Delta Pa/Cu| \geq (n-1) \times \Delta VBL \quad (1)$$

Figure 17:
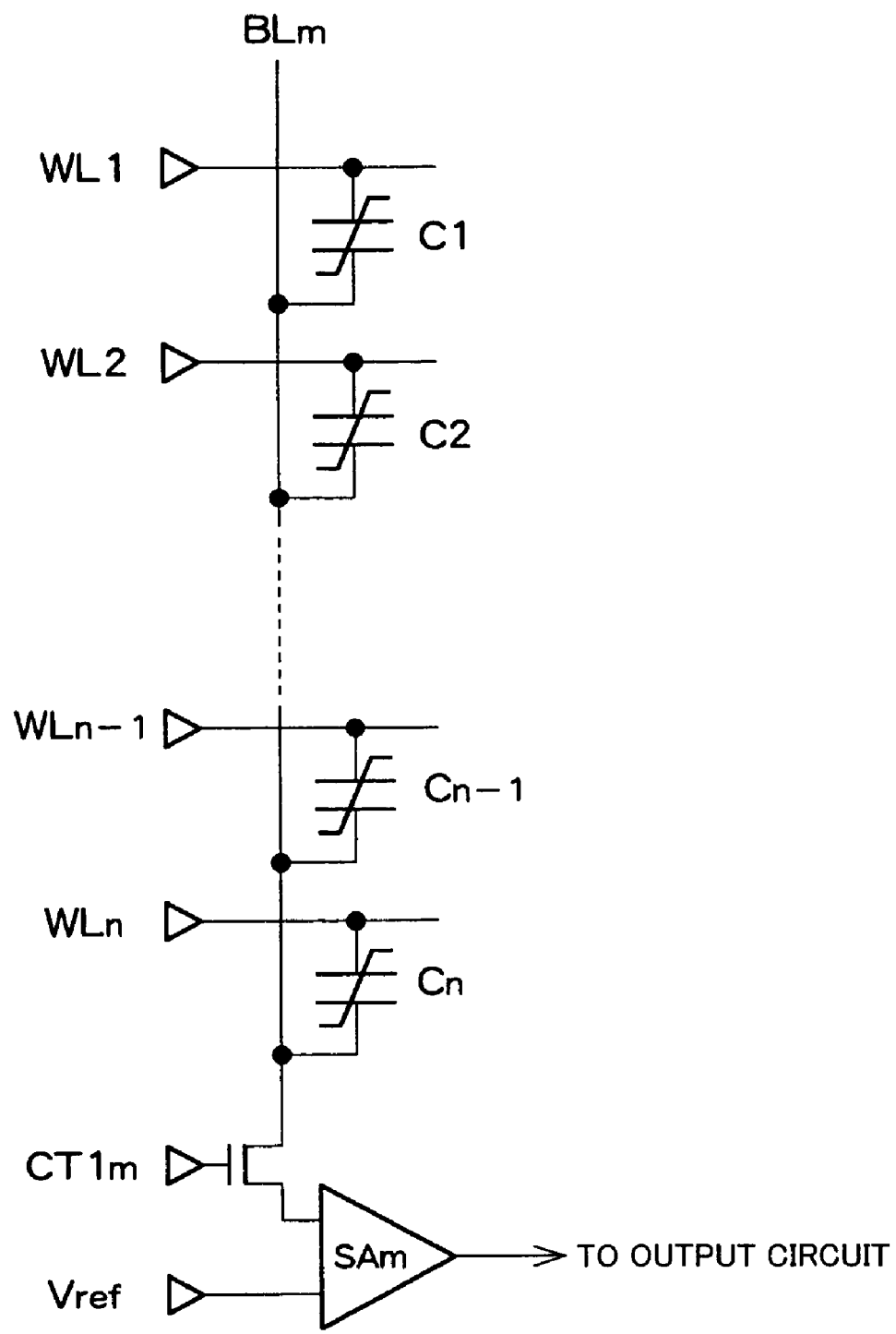
FIG. 17 is a diagram showing n ferroelectric memory cells connected to one bitline, a select gate, and a sense amplifier.

In the equation (1), n denotes the number of ferroelectric memory cells connected to the bitline (or sub-bitline) BLm shown in FIG. 17. In the equation (1), (n−1) denotes the number of unselected cells when one of the n ferroelectric memory cells becomes a selected cell. Provided that a hysteresis function which shows the polarization P ($\mu C/cm^2$) of the ferroelectric memory cell when a voltage V is applied is P=f(V), $\Delta Pa$ denotes the difference between the function f(Vs) when applying the select voltage Vs to one selected memory cell selected from among the n ferroelectric memory cells connected to the bitline BLm and the function f(Vu) when applying the unselect voltage Vu to the remaining unselected memory cells (see FIG. 18). Specifically, $\Delta Pa = f(Vs) - f(Vu)$. In the case where the squareness is excellent and the value of Cu is sufficiently small (when the slope is almost horizontal or the like), $\Delta Pa$ may be approximately equal to $2 \times Pr$. Cu denotes the capacitance (dP/dV; $\mu C/cm^2/V$) of each of the (n−1) unselected memory cells connected to the bitline BLm. $\Delta VBL$ is the minimum input amplitude (V) which can be amplified by a sense amplifier SAm.

Of the above-described parameters, Cu can be derived from the hysteresis characteristics. If the unselect voltage V=Vu, Cu can be obtained by differentiating the hysteresis characteristics (P–V curve) when V=Vu. Specifically, Cu is the slope (index of squareness) at each point at which the voltage Vu or −Vu shown in FIG. 18 intersects the P–V curve, whereby $Cu = dP/dV \approx \Delta P/\Delta V$ is obtained. The difference $\Delta$ is an arbitrary difference, and may be set at the sensitivity threshold of a measuring device.

The squareness of the hysteresis characteristics may be expressed by the following equation (2).

Figure 18:
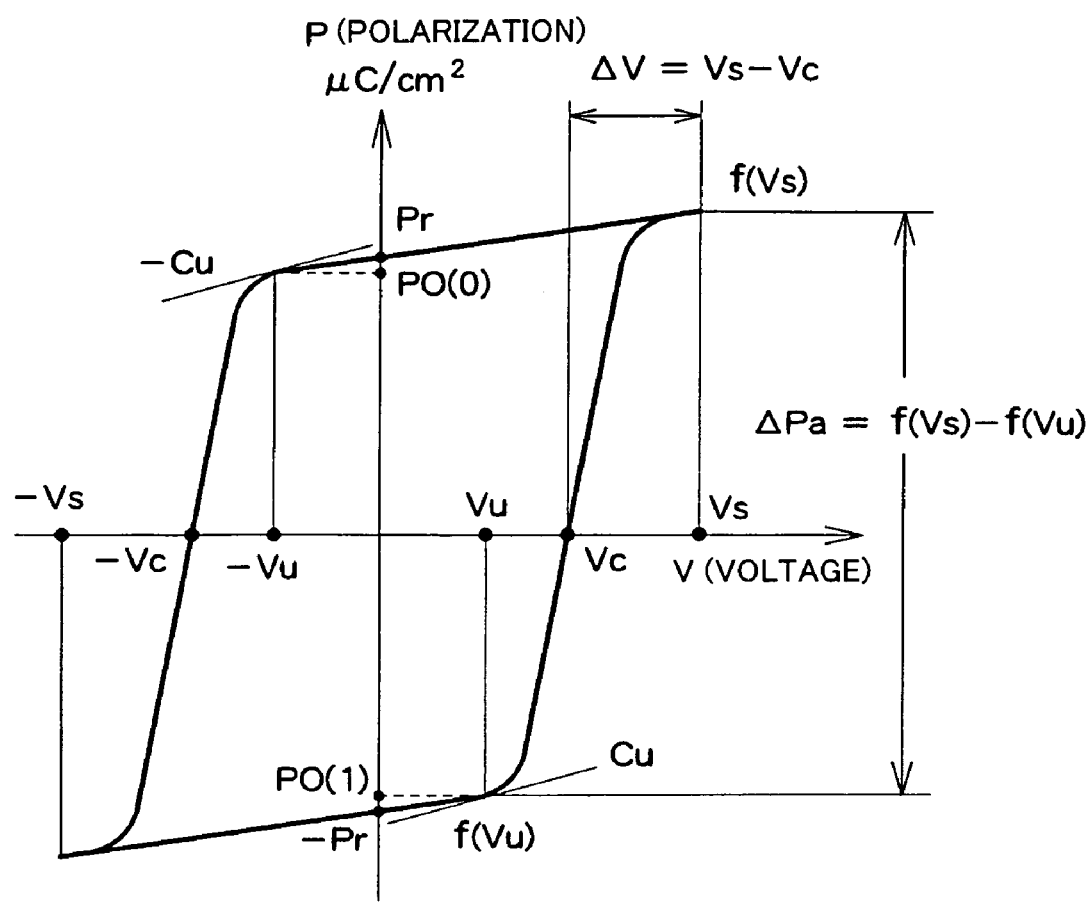
FIG. 18 is a graph showing a polarization-voltage hysteresis curve of a ferroelectric capacitor according to one embodiment of the present invention.

Specifically, provided that the coercive voltage of the ferroelectric memory cell is denoted by Vc, the select voltage (voltage at the same polarity as the coercive voltage) applied to the ferroelectric memory cell is denoted by Vs, and Vs−Vc equals $\Delta V$ as shown in FIG. 18, the equation (2) is expressed as follows.

$$\Delta V \leq Vc \quad (2)$$

In the hysteresis characteristics with excellent squareness as shown in FIG. 18, $\Delta V \leq Vc$ is satisfied. This characteristics are not observed for a conventional ferroelectric capacitor. |Vs|>|Vc| is satisfied insofar as the squareness shown in FIG. 18 is maintained. Therefore, |Vs|−|Vc|>0 is always satisfied. In particular, it is important that the following equation (3) be satisfied in practice even after the ferroelectric memory device is subjected to the imprint test.

$$|Vs| > |Vc| \quad (3)$$

A suitable example of a ferroelectric thin film used for a ferroelectric memory device having hysteresis characteristics with excellent squareness is described in detail in the prior application applied for by the applicant of the present invention (Japanese Patent Application No. 2003-286562) or the like.

Although only some embodiments of the present invention have been described in detail above, those skilled in the art will readily appreciate that many modifications are possible in the embodiments without materially departing from the novel teachings and advantages of this invention. Accordingly, all such modifications are intended to be included within scope of this invention.

What is claimed is:

1. A ferroelectric memory device comprising:
   a plurality of wordlines disposed in parallel;
   a plurality of bitlines disposed in parallel and intersect the wordlines;
   a plurality of ferroelectric memory cells formed at intersections between the wordlines and the bitlines;
   a wordline driver which drives the wordlines; and
   a bitline driver which drives the bitlines, wherein:
   the wordline driver and the bitline driver switch an operation mode of the ferroelectric memory device to a first mode which is one of one of a data reading mode, a data rewriting mode and a data writing mode, by applying a voltage having a first polarity to at least one ferroelectric memory cell selected from the ferroelectric memory cells; and
   the wordline driver and the bitline driver switch the operation mode to a second mode in which the ferroelectric memory device prevents an imprint by applying a voltage having a second polarity which is the reverse of the first polarity to the selected ferroelectric memory cell, after the operation mode has been switched to the first mode at least once, the voltage of the second polarity causing no inversion data stored in the ferroelectric memory cells;
   wherein between the first and second modes, the wordline driver and the bitline driver switch the operation mode to an equalization mode in which potentials of one of the wordlines and one of the bitlines connected to the selected ferroelectric memory cell are equalized;

the wordline driver supplies one of two types of selected potentials to one of the wordlines connected to the selected ferroelectric memory cell, and supplies one of two types of unselected potentials to another one of the wordlines connected to an unselected ferroelectric memory cell among the ferroelectric memory cells in the first mode;

the bitline driver supplies the other of the two types of selected potentials to one of the bitlines connected to the selected ferroelectric memory cell, and supplies the other of the two types of unselected potentials to another one of the bitlines connected to the unselected ferroelectric memory cell in the first mode;

the wordline driver supplies a potential used in the equalization mode to the wordlines in the second mode; and the bitline driver supplies one of the two types of the unselected potentials to one of the bitlines connected to the selected ferroelectric memory cell and supplies the potential used in the equalization mode to the other of the bitlines in the second mode.

2. The ferroelectric memory device as defined in claim 1, wherein each of the ferroelectric memory cells is formed of only a ferroelectric capacitor.

3. The ferroelectric memory device as defined in claim 1, further comprising:

a counter which determines whether or not the operation mode is switched to the first mode predetermined two or more times, wherein the wordline driver and the bitline driver switches the operation mode to the second mode based on output from the counter.

4. The ferroelectric memory device as defined in claim 1, wherein:

the wordlines are connected to the wordline driver and the number of the wordlines is N, the bitlines are connected to the bitline driver and the number of the bitlines is M, and the number of the ferroelectric memory cells is M×N (M and N are natural numbers larger than 1), wherein one of an effective address in at least one of the M×N number of the ferroelectric memory cells and an ineffective address which is other than the effective address and corresponds to a virtual memory cell is selected; and the wordline driver and the bitline driver switches the operation mode to the first mode when the effective address in at least one of the M×N ferroelectric memory cells is selected, and switches the operation mode to the second mode after the effective address has been selected at least once and the first mode has been performed at least once when when the ineffective address is selected.

5. The ferroelectric memory device as defined in claim 1, further comprising:

a sense amplifier selectively connected to one of the bitlines, wherein the ferroelectric memory device satisfies:

$|\Delta Pa/Cu| \geq (n-1) \times \Delta VBL$ where:

n is the number of ferroelectric memory cells connected to one of the bitlines among the ferroelectric memory cells and n is a natural number larger than 1;

$\Delta Pa$ is a difference between a function f (Vs) when applying a voltage Vs to one of the n ferroelectric memory cells, and a function f (Vu) when applying a voltage Vu to the other of the n ferroelectric memory cells, provided that a hysteresis function showing polarization P ($\mu C/cm^2$) of the ferroelectric memory cells when a voltage V is applied to the ferroelectric memory cells is f (V), and $\Delta Pa = f(Vs) - f(Vu)$;

Cu is a capacitance ($\mu C/cm2/V$) of an (n−1) ferroelectric memory cell connected to one of the bitlines among the ferroelectric memory cells; and $\Delta VBL$ is the minimum input amplitude (V) which can be amplified by the sense amplifier.

6. The ferroelectric memory device as defined in claim 1, wherein in the first mode, provided that a coercive voltage of the ferroelectric memory cells is denoted by Vc, a voltage having the same polarity as the coercive voltage and applied to the selected ferroelectric memory is denoted by Vs, and Vs−Vc=$\Delta V$, the ferroelectric memory device satisfies $\Delta V \leq Vc$.

7. A ferroelectric memory device comprising:

a plurality of wordlines disposed in parallel;

a plurality of bitlines disposed in parallel and intersect the wordlines;

a plurality of ferroelectric memory cells formed at intersections between the wordlines and the bitlines;

a wordline driver which drives the wordlines; and a bitline driver which drives the bitlines, wherein:

the wordline driver and the bitline driver switch an operation mode of the ferroelectric memory device to a first mode which is one of one of a data reading mode, a data rewriting mode and a data writing mode, by applying a voltage having a first polarity to at least one ferroelectric memory cell selected from the ferroelectric memory cells;

the wordline driver and the bitline driver switch the operation mode to a second mode in which the ferroelectric memory device prevents an imprint by applying a voltage having a second polarity which is the reverse of the first polarity to the selected ferroelectric memory cell, after the operation mode has been switched to the first mode at least once, the voltage of the second polarity causing no inversion data stored in the ferroelectric memory cells;

between the first and second modes, the wordline driver and the bitline driver switch the operation mode to an equalization mode in which potentials of one of the wordlines and one of the bitlines connected to the selected ferroelectric memory cell are equalized;

the bitline driver supplies one of two types of selected potentials to one of the bitlines connected to the selected ferroelectric memory cell, and supplies one of two types of unselected potentials to another one of the bitlines connected to an unselected ferroelectric memory cell among the ferroelectric memory cells in the first mode;

the wordline driver supplies the other of the two types of selected potentials to one of the wordlines connected to the selected ferroelectric memory cell, and supplies the other of the two types of unselected potentials to another one of the wordlines connected to the unselected ferroelectric memory cell in the first mode;

the bitline driver supplies a potential used in the equalization mode to the bitlines in the second mode; and the wordline driver supplies one of the two types of the unselected potentials to one of the wordlines connected to the selected ferroelectric memory cell and supplies the potential used in the equalization mode to the other of the wordlines in the second mode.

8. A driver circuit connected to a ferroelectric memory section having a plurality of ferroelectric memory cells formed at intersections between a plurality of wordlines and a plurality of bitlines, the driver circuit comprising:
- a wordline driver which drives the wordlines; and
- a bitline driver which drives the bitlines, wherein:
  - the wordline driver and the bitline driver switch an operation mode of the ferroelectric memory device to a first mode which is one of a data reading mode, a data rewriting mode and a data writing mode, by applying a voltage having a first polarity to at least one ferroelectric memory cell selected from the ferroelectric memory cells;
  - the wordline driver and the bitline driver switch the operation mode to a second mode in which the ferroelectric memory device prevents an imprint by applying a voltage having a second polarity which is the reverse of the first polarity to the selected ferroelectric memory cell, after the operation mode has been switched to the first mode at least once, the voltage of the second polarity causing no inversion of data stored in the ferroelectric memory cells;
  - between the first and second modes, the wordline driver and the bitline driver switch the operation mode to an equalization mode in which potentials of one of the wordlines and one of the bitlines connected to the selected ferroelectric memory cell are equalized;
  - the wordline driver supplies one of two types of selected potentials to one of the wordlines connected to the selected ferroelectric memory cell, and supplies one of two types of unselected potentials to another one of the wordlines connected to an unselected ferroelectric memory cell among the ferroelectric memory cells in the first mode;
  - the bitline driver supplies the other of the two types of selected potentials to one of the bitlines connected to the selected ferroelectric memory cell, and supplies the other of the two types of unselected potentials to another one of the bitlines connected to the unselected ferroelectric memory cell in the first mode;
  - the wordline driver supplies a potential used in the equalization mode to the wordlines in the second mode; and
  - the bitline driver supplies one of the two types of the unselected potentials to one of the bitlines connected to the selected ferroelectric memory cell and supplies the potential used in the equalization mode to the other of the bitlines in the second mode.

9. The driver circuit as defined in claim 8, further comprising:
- a sense amplifier selectively connected to one of the bitlines, wherein the ferroelectric memory device satisfies:

$$|\Delta Pa/Cu| \geq (n-1) \times \Delta VBL$$

where:
- N is the number of ferroelectric memory cells connected to one of the bitlines among the ferroelectric memory cells and n is a natural number larger than 1;
- $\Delta Pa$ is a difference between a function $f(Vs)$ when applying a voltage Vs to one of the n ferroelectric memory cells, and a function $f(Vu)$ when applying a voltage Vu to the other of the n ferroelectric memory cells, provided that a hysteresis function showing polarization P ($\mu C/cm^2$) of the ferroelectric memory cells when a voltage V is applied to the ferroelectric memory cells is $f(V)$, and $\Delta Pa = f(Vs) - f(Vu)$;
- Cu is a capacitance ($\mu C/cm^2/V$) of an (n-1) ferroelectric memory cell connected to one of the bitlines among the ferroelectric memory cells; and
- $\Delta VBL$ is the minimum input amplitude (V) which can be amplified by the sense amplifier.

10. The driver circuit as defined in claim 8, wherein in the first mode, provided that a coercive voltage of the ferroelectric memory cells is denoted by Vc, a voltage having the same polarity as the coercive voltage and applied to the selected ferroelectric memory cell is denoted by Vs, and Vs−Vc=$\Delta V$, the ferroelectric memory device satisfies $\Delta V \leq \Delta Vc$.

11. A driver circuit connected to a ferroelectric memory section having a plurality of ferroelectric memory cells formed at intersections between a plurality of wordlines and a plurality of bitlines, the driver circuit comprising:
- a wordline driver which drives the wordlines; and
- a bitline driver which drives the bitlines, wherein:
  - the wordline driver and the bitline driver switch an operation mode of the ferroelectric memory device to a first mode which is one of a data reading mode, a data rewriting mode and a data writing mode, by applying a voltage having a first polarity to at least one ferroelectric memory cell selected from the ferroelectric memory cells;
  - the wordline driver and the bitline driver switch the operation mode to a second mode in which the ferroelectric memory device prevents an imprint by applying a voltage having a second polarity which is the reverse of the first polarity to the selected ferroelectric memory cell, after the operation mode has been switched to the first mode at least once, the voltage of the second polarity causing no inversion of data stored in the ferroelectric memory cells;
  - between the first and second modes, the wordline driver and the bitline driver switch the operation mode to an equalization mode in which potentials of one of the wordlines and one of the bitlines connected to the selected ferroelectric memory cell are equalized;
  - the bitline driver supplies one of two types of selected potentials to one of the bitlines connected to the selected ferroelectric memory cell, and supplies one of two types of unselected potentials to another one of the bitlines connected to an unselected ferroelectric memory cell among the ferroelectric memory cells in the first mode;
  - the wordline driver supplies the other of the two types of selected potentials to one of the wordlines connected to the selected ferroelectric memory cell, and supplies the other of the two types of unselected potentials to another one of the wordlines connected to the unselected ferroelectric memory cell in the first mode;
  - the bitline driver supplies a potential used in the equalization mode to the bitlines in the second mode; and
  - the wordline driver supplies one of the two types of the unselected potentials to one of the wordlines connected to the selected ferroelectric memory cell and supplies the potential used in the equalization mode to the other of the wordlines in the second mode.

* * * * *

UNITED STATES PATENT AND TRADEMARK OFFICE
CERTIFICATE OF CORRECTION

PATENT NO. : 7,142,445 B2 Page 1 of 1
APPLICATION NO. : 10/932890
DATED : November 28, 2006
INVENTOR(S) : Yasuaki Hamada, Takeshi Kijima and Eiji Natori It is certified that error appears in the above-identified patent and that said Letters Patent is hereby corrected as shown below:

| | |
|---|---|
| Column 3, Line 13: | After "characteristic", insert --of--. |
| Column 3, Line 60: | After "polarity", insert --of--. |
| Column 5, Line 32: | After "according", insert --to--. |
| Column 8, Line 31: | After "polarity", insert --of--. |
| Column 9, Line 37: | After "polarity", insert --of--. |
| Column 9, Line 50: | After "polarity", insert --of--. |
| Column 12, Line 15: | "This" should be --These--. |
| Column 13, Line 51 Claim 1: | Delete second occurrence of "when". |
| Column 14, Line 14 Claim 6: | After "memory", insert --cell--. |
| Column 16, Line 14 Claim 10: | "$\Delta V \leq \Delta Vc$" should be -- $\Delta V \leq Vc$--. |

Signed and Sealed this

Sixth Day of November, 2007

JON W. DUDAS
*Director of the United States Patent and Trademark Office*